United States Patent
Chiu et al.

(10) Patent No.: US 11,935,830 B2
(45) Date of Patent: Mar. 19, 2024

(54) INTEGRATED CIRCUIT WITH FRONTSIDE AND BACKSIDE CONDUCTIVE LAYERS AND EXPOSED BACKSIDE SUBSTRATE

(71) Applicant: Taiwan Semiconductor Manufacturing Company, Ltd., Hsinchu (TW)

(72) Inventors: Te-Hsin Chiu, Hsinchu (TW); Shih-Wei Peng, Hsinchu (TW); Wei-Cheng Lin, Taichung (TW); Jiann-Tyng Tzeng, Hsinchu (TW); Jiun-Wei Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/446,515

(22) Filed: Aug. 31, 2021

(65) Prior Publication Data

US 2023/0065663 A1    Mar. 2, 2023

(51) Int. Cl.
*H01L 23/528* (2006.01)
*H01L 21/38* (2006.01)
*H01L 21/768* (2006.01)

(52) U.S. Cl.
CPC ............ *H01L 23/528* (2013.01); *H01L 21/38* (2013.01); *H01L 21/768* (2013.01)

(58) Field of Classification Search
CPC ...... H01L 23/528; H01L 21/38; H01L 21/768
USPC .......................................................... 257/773
See application file for complete search history.

(56) References Cited

U.S. PATENT DOCUMENTS

2022/0068767 A1* 3/2022 Khalil ................. H01L 23/4824
2022/0157849 A1* 5/2022 Lee ................... H01L 27/11556

* cited by examiner

*Primary Examiner* — Quoc D Hoang
(74) *Attorney, Agent, or Firm* — MERCHANT & GOULD P.C.

(57) ABSTRACT

An integrated circuit includes multiple backside conductive layers disposed over a backside of a substrate. The multiple backside conductive layers each includes conductive segments. The conductive segments in at least one of the backside conductive layers are configured to transmit one or more power signals. The conductive segments of the multiple backside conductive layers cover select areas of the backside of the substrate, thereby leaving other areas of the backside of the substrate exposed.

20 Claims, 15 Drawing Sheets

INTEGRATED CIRCUIT WITH FRONTSIDE AND BACKSIDE CONDUCTIVE LAYERS AND EXPOSED BACKSIDE SUBSTRATE

BACKGROUND

An integrated circuit (IC) includes a substrate, one or more circuits formed within and/or above the substrate, and conductive lines that interconnect the components of a circuit to each other, or interconnect one circuit to another circuit. The conductive lines route data signals and power signals (e.g., voltage signals) to the components in the IC as well as circuits outside of the IC. Some ICs are formed with devices and/or conductive lines on both a frontside of the substrate and a backside of the substrate. In some situations, the conductive line or lines positioned on the backside of the IC can adversely impact various testing and analyses processes. For example, the backside conductive lines that transmit power signals can limit or prohibit the detection of signals from the backside of the substrate during a process failure analysis (PFA) that uses a laser, an Emission Microscopy (EMMI) analysis, and an electron beam inspection (EBI).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
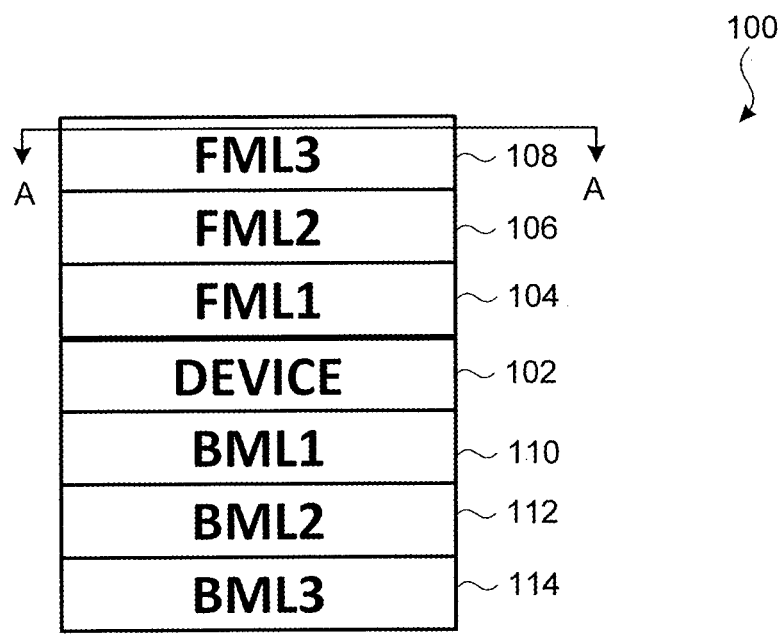
FIG. 1 depicts an example integrated circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits are commonly used in various electronic devices. Integrated circuits include circuits that provide or contribute to the functionality or functionalities of the integrated circuit. Non-limiting example circuits are logic components such as a flip flop, latch, inverter, NAND, OR, AND, and NOR circuits, as well as amplifiers, buffers, and transistors. Conductive interconnects, such as metal conductors, are commonly used to route signals and voltage sources to and from the circuits (or contact pads associated with the circuits). Embodiments discussed herein provide various layouts for the backside conductive lines that enable testing and analyses procedures to detect one or more signals from the backside of the substrate. Different layouts for the backside metal layers is disclosed. Briefly, the layouts produce backside conductive lines that cover only select areas of the backside of the substrate, leaving other areas of the backside of the substrate exposed for testing procedures such as laser, EMMI, and EBI processes.

Embodiments herein are described with respect to metal layers, metal conductors, metal segments, and poly lines.

However, other embodiments are not limited to metal and poly as the conductive material. Any suitable conductor that is made of one or more conductive materials can be used in place of the metal layers, metal conductors, metal segments, and poly lines.

These and other embodiments are discussed below with reference to FIGS. 1-19. However, those skilled in the art will readily appreciate that the detailed description given herein with respect to these Figures is for explanatory purposes only and should not be construed as limiting.

FIG. 1 depicts an example integrated circuit in accordance with some embodiments. The integrated circuit (IC) 100 includes a device 102. The device 102 is implemented as one or more circuits that are formed within, on, and/or above a substrate (e.g., substrate 200 in FIG. 2). Each circuit typically includes one or more components (e.g., active components). Example circuits include, but are not limited to, a NAND circuit, a NOR circuit, an inverter, a flip flop, a latch, and/or an amplifier.

Positioned above the device 102 is a first frontside metal (FML1) layer 104. Once example of a FML1 layer 104 is a frontside M0 layer. The FML1 layer 104 includes metal conductors that are operable to route power signals and data signals to, within, and from the device 102. Disposed above the FML1 layer 104 is a second frontside metal (FML2) layer 106. One example of a FML2 layer 106 is a frontside M1 layer. Positioned above the FML2 layer 106 is a third frontside metal (FML3) layer 108. One example of a FML3 layer 108 is a frontside M2 layer. Like the FML1 layer 104, the FML2 layer 106 and the FML3 layer 108 each includes metal conductors that are configured to route power signals and data signals to, within, and from the device 102.

Disposed below the device 102 is a first backside metal (BML1) layer 110. Once example of a BML1 layer 110 is a backside M0 layer. The BML1 layer 110 includes metal conductors that are operable to route data signals to, within, and from the device 102. Disposed under the BML1 layer 110 is a second backside metal (BML2) layer 112. One example of a BML2 layer 112 is a backside M1 layer. The BML2 layer 112 includes metal conductors that are configured to route power signals (e.g., one or more voltage signals such as VDD and VSS signals) and possibly data signals to, within, and from the device 102.

Positioned under the BML2 layer 112 is a third backside metal (BML3) layer 114. One example of a BML3 layer 114 is a backside M2 layer. The BML3 layer 114 includes metal conductors that are operable to route one or more data signals to, within, and from the device 102. In some embodiments, the BML1 layer 110 and the BML3 layer 114 can also be configured to route power signals (e.g., VDD or VSS voltage signals).

Figure 2:
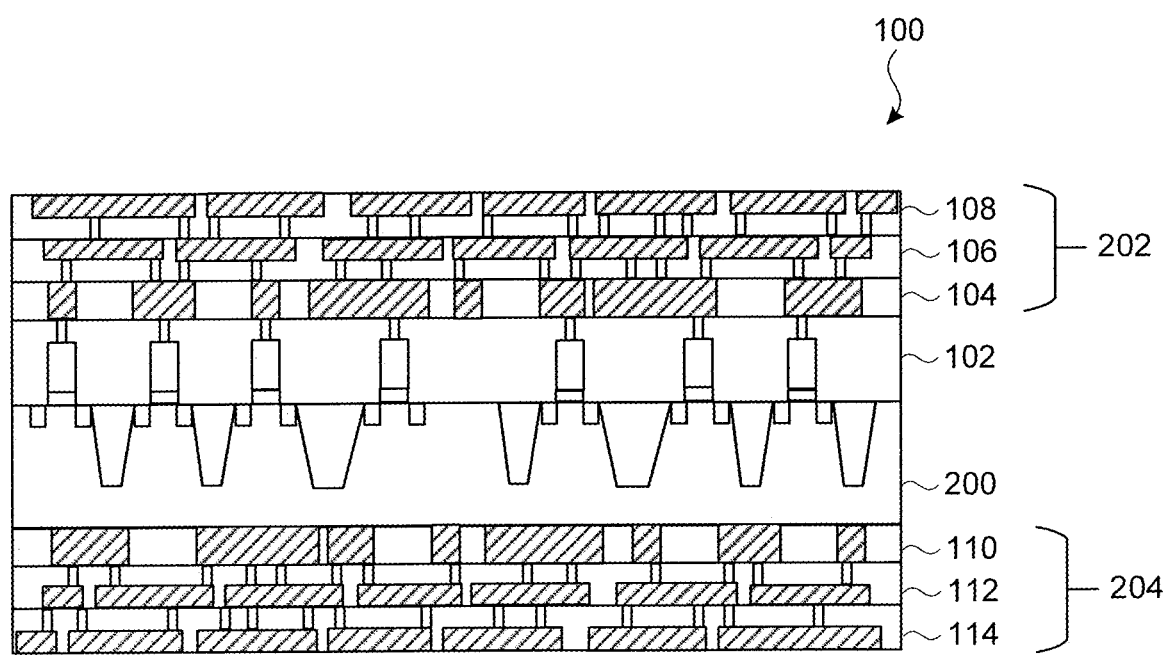
FIG. 2 illustrates a cross-sectional view of the example integrated circuit taken along line A-A in FIG. 1 in accordance with some embodiments.

FIG. 2 depicts a cross-sectional view of the example integrated circuit taken along line A-A in FIG. 1 in accordance with some embodiments. The integrated circuit 100 includes a substrate 200, a device 102, a frontside interconnect structure 202, and a backside interconnect structure 204. The substrate 200 is implemented with any suitable substrate. For example, the substrate 200 can be a semiconductor substrate, a gallium nitride substrate, or a silicon carbide substrate.

The frontside interconnect structure 202 includes the FML1 layer 104, the FML2 layer 106, and the FML3 layer 108. Each frontside metal layer 104, 106, 108 includes metal conductors that interconnect a component of the device 102 to another component of the device 102 and/or to one or more power sources (e.g., VDD and VSS).

The backside interconnect structure 204 includes the BML1 layer 110, the BML2 layer 112, and the BML3 layer 114. Each backside metal layer 110, 112, 114 includes metal conductors that are configured to route one or more power signals (e.g., VDD and VSS) within the integrated circuit 100. At least one of the backside metal layers 110, 112, 114 can also be operable to route data signals between the components of the device 102. Although FIGS. 1 and 2 present three frontside and three backside metal layers 104, 106, 108, 110, 112, 114, other embodiments can include any number of frontside and backside metal layers.

Figure 3:
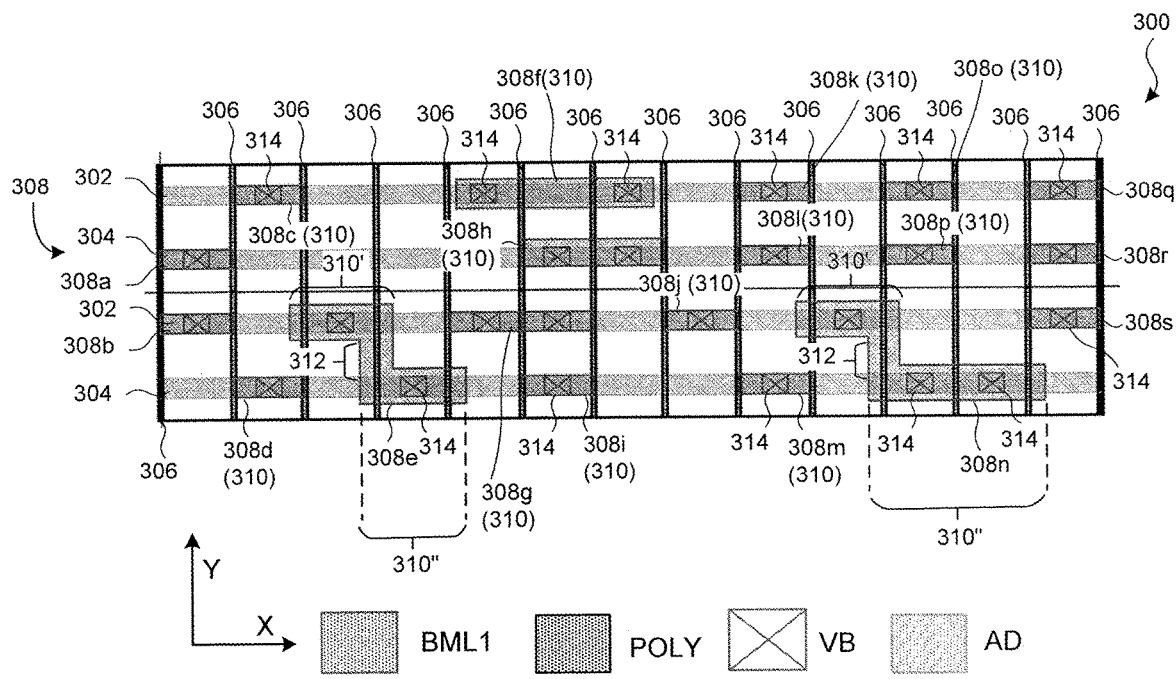
FIG. 3 depicts an example layout of a first backside metal layer in accordance with some embodiments.

FIG. 3 depicts an example layout of a first backside metal layer in accordance with some embodiments. The layout 300 includes a first active diffusion (AD) region 302 and a second AD region 304 formed in a backside of a substrate (e.g., substrate 600 in FIG. 6) that are disposed in the x direction. Polysilicon lines 306 are disposed in the y direction over the first and the second AD regions 302, 304.

The first and the second AD regions 302, 304 can include fin structures that are disposed on a backside of the substrate and serve as active regions of transistors, such as field effect (FET) or metal oxide semiconductor (MOS) transistors. Specifically, the fin structures may serve as channel regions of the transistors when positioned below the polysilicon lines 306 and/or serve as source regions or drain regions when positioned below metal layers. In a non-limiting example, the first AD region 302 is a source/drain region for a p-type transistor and the second AD region 304 is a source/drain region for an n-type transistor. The polysilicon lines 306 serve as the gate electrodes of the transistors. As such, the polysilicon lines 306 are referred to herein as gate lines 306.

A first backside metal (BML1) layer 308 is disposed over portions of the first AD region 302, the second AD region 304, and the gate lines 306. The BML1 layer 308 includes conductive segments 308a through 308s. In the illustrated embodiment, conductive segments 308a through 308s include first sections 310 that are positioned in the x direction over the portions of the first AD region 302, the second AD region 304, and the gate lines 306. Conductive segments 308e, 308n include second sections 312 that are disposed in they direction to connect two first sections 310 together, where the first sections 310' are positioned over the first AD region 302 and first sections 310" are disposed over the second AD region 304. Conductive vias (VB) 314 electrically connect respective first sections 310 of the conductive segments 308a through 308s to the first AD region 302 or to the second AD region 304.

Figure 4:
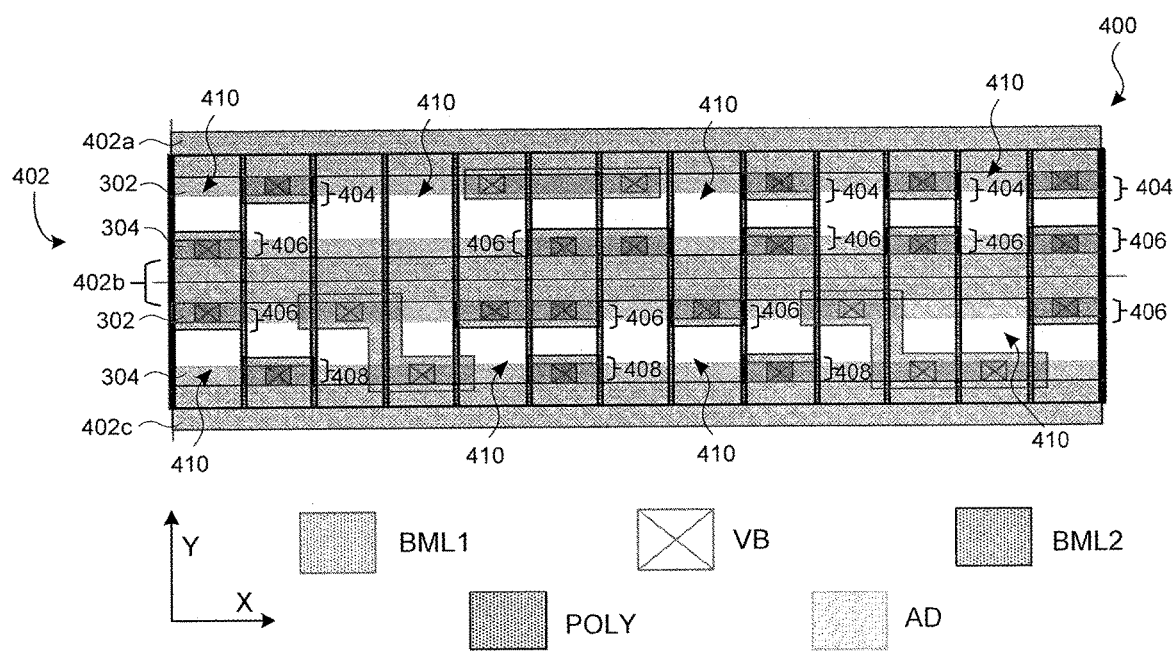
FIG. 4 illustrates an example layout of a second backside metal layer in accordance with some embodiments.

FIG. 4 illustrates an example layout of a second backside metal layer in accordance with some embodiments. The layout 400 includes the second backside metal (BML2) layer 402 having conductive segments 402a, 402b, 402c. The conductive segments 402a, 402b, 402c are positioned in the x direction adjacent the first and the second AD regions 302, 304 and over portions of the gate lines 306. In the illustrated embodiment, the conductive segments 402a, 402b, 402c are configured to provide power from one or more voltage sources to some or all of the cells in an IC, were a cell can include electrical component(s) or circuit(s). For example, in one embodiment, the conductive segments 402a, 402c supply a first voltage signal from a first voltage source (e.g., a VDD signal from a VDD voltage source) and the conductive segment 402b provides a second voltage signal from a second voltage source (e.g., a VSS signal from a VSS voltage source).

Sections 404 of the conductive segment 402a extend in they direction towards and over portions of the first AD region 302 and over portions of the BML1 layer 308. Sections 406 of the conductive segment 402b extend in the y direction towards and over portions of the first and the second AD regions 302, 304 and over portions of the BML1 layer 308. Sections 408 of the conductive segment 402c extend in the y direction towards and over portions of the second AD region 304 and over portions of the BML1 layer 308. In one embodiment, the BML1 layer 308 is the lowest backside metal layer (BM0 layer) and the BML2 layer 402 is the first backside metal layer (BM1 layer) positioned over the BM0 layer.

In the embodiment shown in FIG. 4, areas 410 of the backside of the substrate are not covered by the BML1 layer 308 and the BML2 layer 402. Instead, the areas 410 are exposed and are detectable during various testing procedures. The areas 410 include portions of the substrate, the first AD region 302, and the second AD region 304. One example of a testing procedure is a backside power rail PFA that uses laser, EMMI, and/or EBI during testing. As will be described in more detail later, various embodiments expose different areas of the substrate for testing and analysis.

Figure 5:
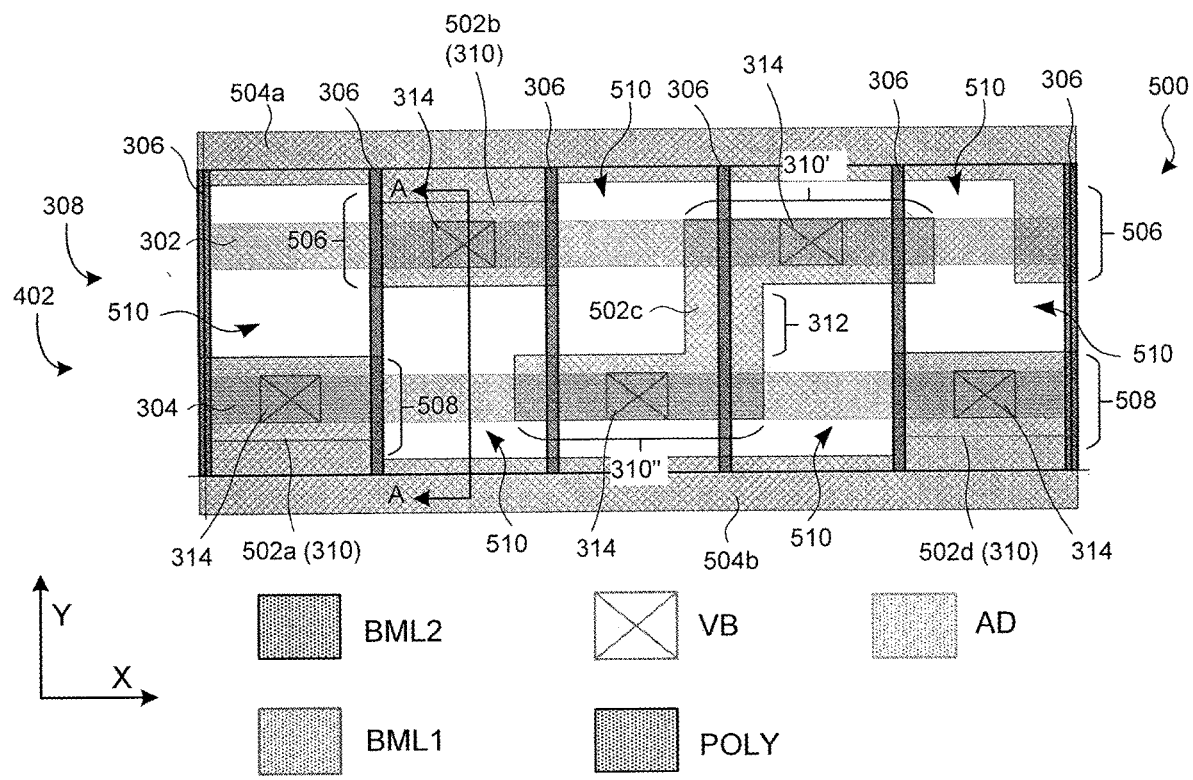
FIG. 5 depicts an example layout of a portion of a first integrated circuit in accordance with some embodiments.

FIG. 5 depicts an example layout of a portion of a first integrated circuit in accordance with some embodiments. The layout 500 includes the first AD region 302 and the second AD region 304 formed in a backside of a substrate and disposed in the x direction. Gate lines 306 are disposed in the y direction over the first and the second AD regions 302, 304.

A BML1 layer 308 that includes conductive segments 502a, 502b, 502c, 502d is disposed over portions of the first AD region 302, the second AD region 304, and the gate lines 306. In the illustrated embodiment, first sections 310 of the conductive segments 502a through 502d are positioned in the x direction over the portions of the first and the second AD regions 302, 304. A second section 312 of the conductive segment 308c is disposed in they direction to connect two first sections 310 together, where one of the first sections 310' is positioned over the first AD region 302 and the other first section 310" is disposed over the second AD region 304. Conductive vias (VB) 314 electrically connect respective first sections 310 of the BML1 layer 308 to the first AD region 302 or to the second AD region 304.

A second backside metal (BML2) layer 402 that includes conductive segments 504a, 504b is positioned in the x direction adjacent the first and the second AD regions 302, 304 and over portions of the gate lines 306. Sections 506 of the conductive segment 504a extend in they direction towards and over portions of the first AD region 302 and over portions of the BML1 layer 308. Sections 508 of the conductive segment 504b extend in the y direction towards and over portions of the second AD region 304 and over portions of the BML1 layer 308. In the illustrated embodiment, the conductive segments 504a, 504b are configured to provide power signals from one or more voltage sources. For example, in one embodiment, the conductive segment 704a supplies a first voltage signal (e.g., a VDD signal) and the conductive segment 704b provides a second voltage signal (e.g., a VSS signal).

The areas 510 of the backside of the substrate are not covered by the backside metal layers (e.g., the BLM1 layer 308 and the BML2 layer 402) and are exposed and detectable, while other areas are covered by at least one backside metal layer (e.g., the BML1 layer 308 and/or the BML2 layer 402). The areas 510 include portions of the substrate, the first AD region 302, and the second AD region 304. In this embodiment, the output region of a cell is included in the areas 510, so the output region is exposed and detectable. The covered areas of the backside of the substrate include the source region and/or the drain region of the cell. The output region of the cells can be in the first AD region 302 and/or in the second AD region 304. An example area 510 is shown in FIG. 6.

One advantage to the embodiment shown in FIG. 5 is that the IC is fabricated with metal to metal contact. In particular, the BML2 layer 402 directly contacts to the BML1 layer 308 at select locations to electrically connect the BML2 layer 402 to the BML1 layer 308. One such direct contact is shown in FIG. 6.

Figure 6:
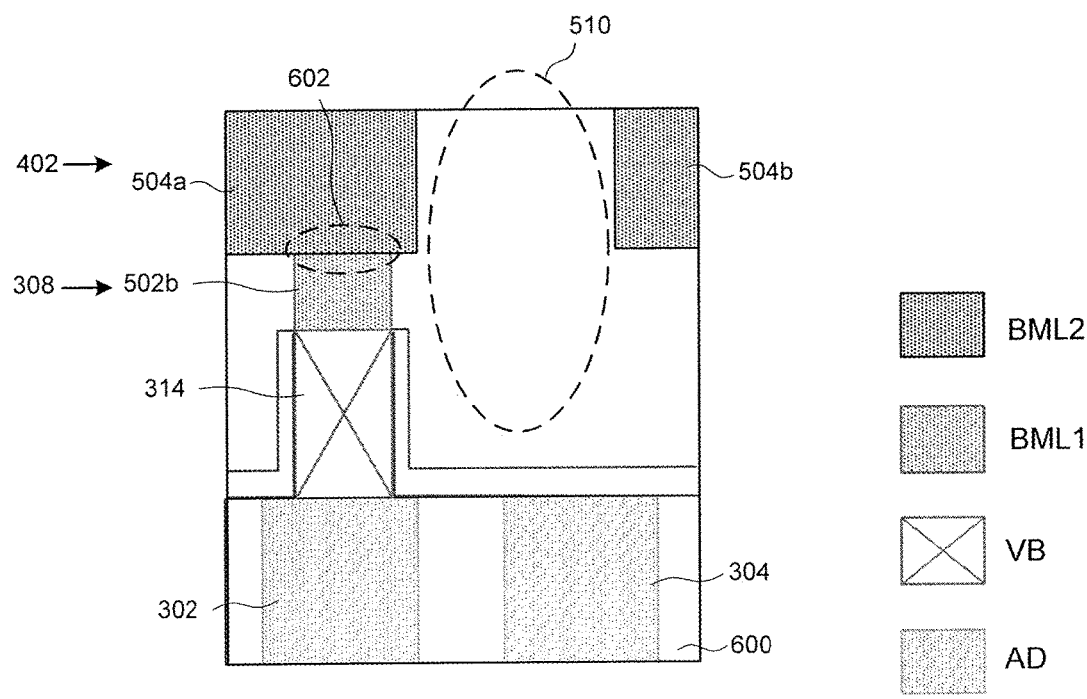
FIG. 6 illustrates a cross-sectional view of the first integrated circuit taken along line A-A in FIG. 5 in accordance with some embodiments.

FIG. 6 illustrates a cross-sectional view of the first integrated circuit taken along line A-A in FIG. 5 in accordance with some embodiments. As described earlier, the first and the second AD regions 302, 304 are formed in a backside of a substrate 600. The substrate 600 can be any suitable type of a substrate. An example substrate includes, but is not limited to, a silicon substrate, a silicon on insulator (SOI) substrate, a Sapphire substrate, or a compound substrate (e.g., a gallium arsenide substrate, a gallium nitride substrate).

The VB 314 is formed over the first AD region 302 and between the first AD region 302 and the BML1 layer 308 (e.g., conductive segment 502b). The VB 314 electrically connects the first AD region 302 to the BML2 layer (e.g., conductive segment 504a). The conductive segment 504a directly contacts the conductive segment 502b at area 602. One advantage to the direct metal to metal contact is a reduction in the height of the IC.

Figure 7:
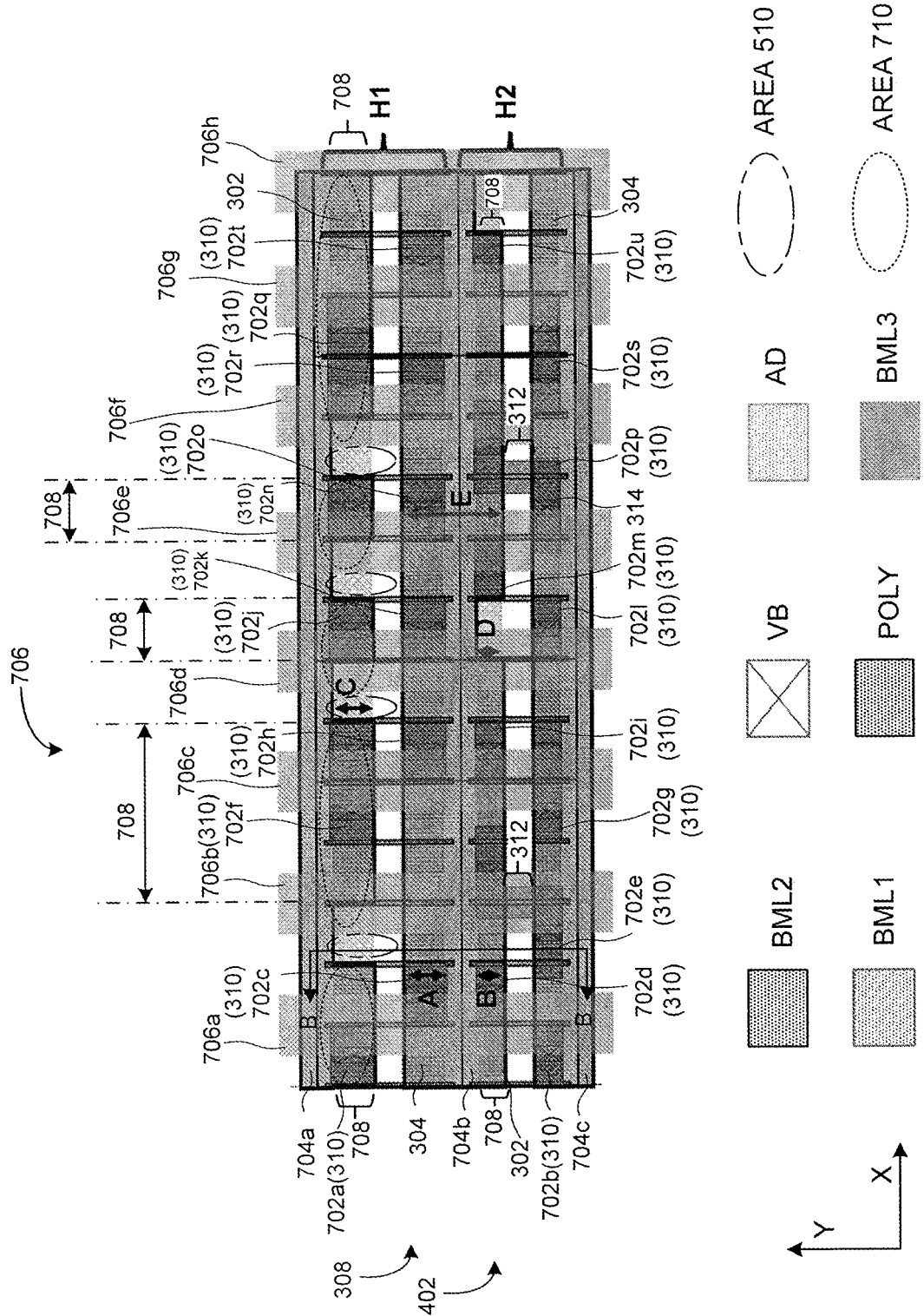
FIG. 7 depicts an example layout of the portion of the first integrated circuit shown in FIG. 5 along with a third backside metal layer in accordance with some embodiments.

FIG. 7 depicts an example layout of the portion of the first integrated circuit shown in FIG. 5 along with a third backside metal layer in accordance with some embodiments. The layout 700 includes the first AD region 302 and the second AD region 304 formed in a backside of a substrate and disposed in the x direction. The gate lines 306 are positioned in the y direction over the first and the second AD regions 302, 304.

The BML1 layer 308 with conductive segments 702a through 702u are disposed over portions of the first AD region 302, the second AD region 304, and the gate lines 306. In the illustrated embodiment, the first sections 310 of the conductive segments 702a-702u are positioned in the x direction over the portions of the first AD region 302, the second AD region 304, and the gate lines 306. Second sections 312 of the conductive segments 702e, 702p are disposed in the y direction to connect two first sections 310 together.

The BML2 layer 402 includes conductive segments 704a, 704b, 704c that are positioned in the x direction adjacent the first and the second AD regions 302, 304 and over portions of the gate lines 306. The BML2 layer 402 is formed over the BML1 layer 308. Like the embodiment shown in FIG. 5, sections 708 of the conductive segments 704a, 704b extend in they direction over select portions of the first AD region 302, the second AD region 304, and the BML1 layer 308.

In the illustrated embodiment, the conductive segments 704a, 704b, 704c are configured to provide power signals from one or more voltage sources to some or all of the cells in the IC. For example, in one embodiment, the conductive segments 704a, 704c supply a first voltage signal from a first voltage source (e.g., a VDD signal from a VDD voltage source) and the conductive segment 704b provides a second voltage signal from a second voltage source (e.g., a VSS signal from a VSS voltage source).

A third backside metal (BML3) layer 706 with conductive segments 706a through 706h is disposed in they direction over portions of the first AD region 302, the second AD region 304, the gate lines 306, the BML1 layer 308, and the BML2 layer 402. The BML3 layer 706 is formed over the BML2 layer 402. In one embodiment, the conductive segments 706a through 706h are configured to transmit data signals.

As described in conjunction with FIG. 5, the areas 510 of the backside of the substrate are not covered by any backside metal layer (e.g., BML1 308, BML2 402, and BML3 706) and are exposed and detectable. The areas 510 include the output regions of the cells, so the output regions are exposed and detectable. As such, an output signal of the cells can be detected in one or more testing or analyses procedures (e.g., a PFA). Additionally, areas 710 of the first and the second AD regions 302, 304 are covered by at least one backside metal layer (e.g., the BML1 layer 308, the BML2 layer 402, and/or the BML3 layer 706). In some embodiments, the areas 710 include all regions of the cells other than the output regions, such as the source and/or the drain regions of the cells. For clarity, only select areas 510 and 710 are identified in FIG. 7.

In a non-limiting nonexclusive embodiment, the minimum spacing between the BML1 layer 308 and the BML2 layer 402 is approximately eighteen (18) nanometers (nm) and the BML1 layer pitch is approximately eighty-one (81) nm. The lengths A, B, C, D, and E are approximately twenty-seven (27) nm, eighteen (18) nm, twenty-four nm, fifteen (15) nm, and sixty-three (63) nm, respectively. The height H1 is approximately ninety (90) nm with a metal pitch of four metal lines in the BML1 layer 308 (e.g., 4M0) and the height H2 is approximately seventy-two (72) nm with a metal pitch of 3 metal lines in the BML1 layer 308 (e.g., 3M0). In some instances, the pitch of the metal lines in the FML1 layer corresponds to the different metal pitches in the BML1 layer 308 to produce a hybrid row design. In one embodiment of a hybrid row design, there are two different cell height. The cell with the taller cell height can have a larger AD region that provides a higher speed. The cell with the shorter cell height may have a smaller AD region that saves power and current. The two different cell heights enable a design to meet multiple requirements of speed, power and/or area.

Additionally, in some embodiments, the pitch of the backside metal layers and the pitch of the gate lines are proportional. The cell is based on the pitch of the gate lines, and the width of the cell is a multiple of the pitch of the gate lines. When the cell is placed in the chip area during IC design, the minimum move step is the pitch of the gate lines. If the pitch of the backside metal layers is proportional to the pitch of the gate lines, the positions of the backside metal layers within the cell are predictable. For example, when the ratio is one (1), the BML1 layer (vertical) is located on the gate or the metal-to-diffusion (MD) position, which can reduce the probability of the backside metal layers blocking the one or more AD regions during the PFA.

Figure 8:
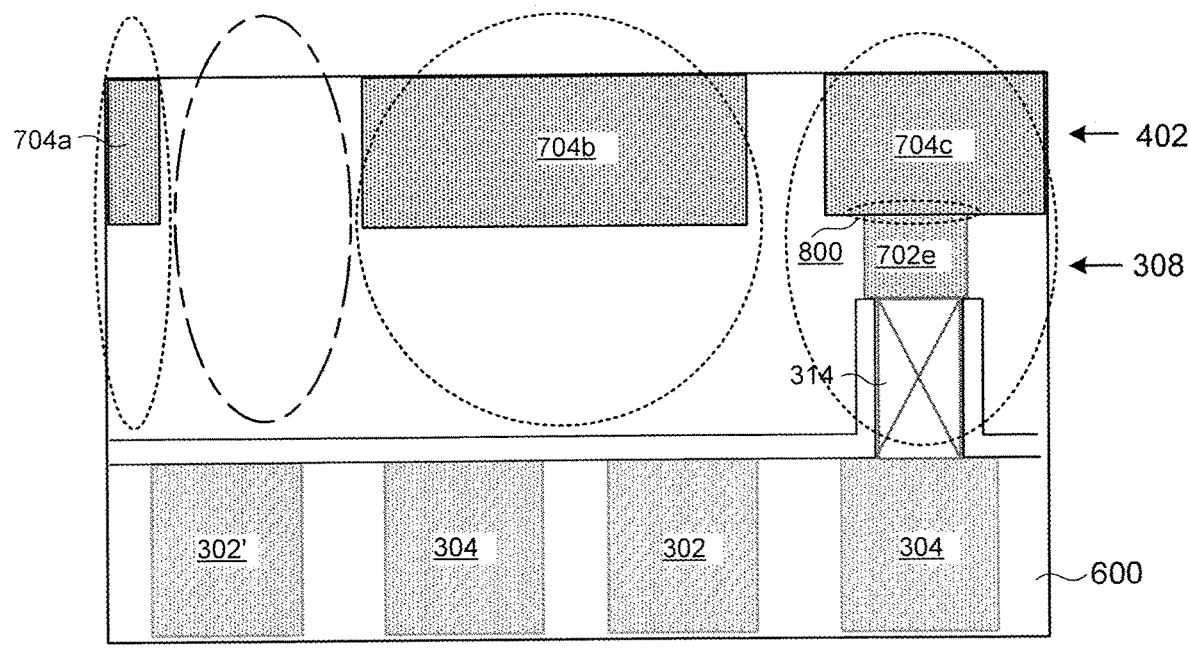
FIG. 8 illustrates a cross-sectional view of the first integrated circuit taken along line B-B in FIG. 7 in accordance with some embodiments.

FIG. 8 illustrates a cross-sectional view of the first integrated circuit taken along line B-B in FIG. 7 in accordance with some embodiments. The two first and the two second AD regions 302, 304 are formed in the substrate 600. The VB 314 is formed over one of the second AD regions 304 and between the second AD region 304 and the BML1 layer 308 (e.g., conductive segment 702e). The VB 314 electrically connects the second AD region 304 to the BML1 layer 308 (e.g., conductive segment 702e). The BML2 layer 402 (e.g., conductive segment 704c) directly contacts the conductive segment 702e at area 800.

The area 510 of the backside of the substrate is not covered by the backside metal layers (e.g., the BML1 layer 308 and the BML2 layer 402) and is exposed and detectable. In the illustrated embodiment, the area 510 includes a portion of the substrate and the first AD region 302'. In this embodiment, the first AD region 302' is the output region of the cell and is exposed and detectable. The areas 710 are covered by at least one backside metal layer (e.g., BML1 layer (e.g., 702e) and/or the BML2 layer 402 (e.g., conductive segments 704a, 704b, 704c). These areas 710 include the regions of the cells other than the output regions, such as the source regions and/or drain regions.

Figure 9:
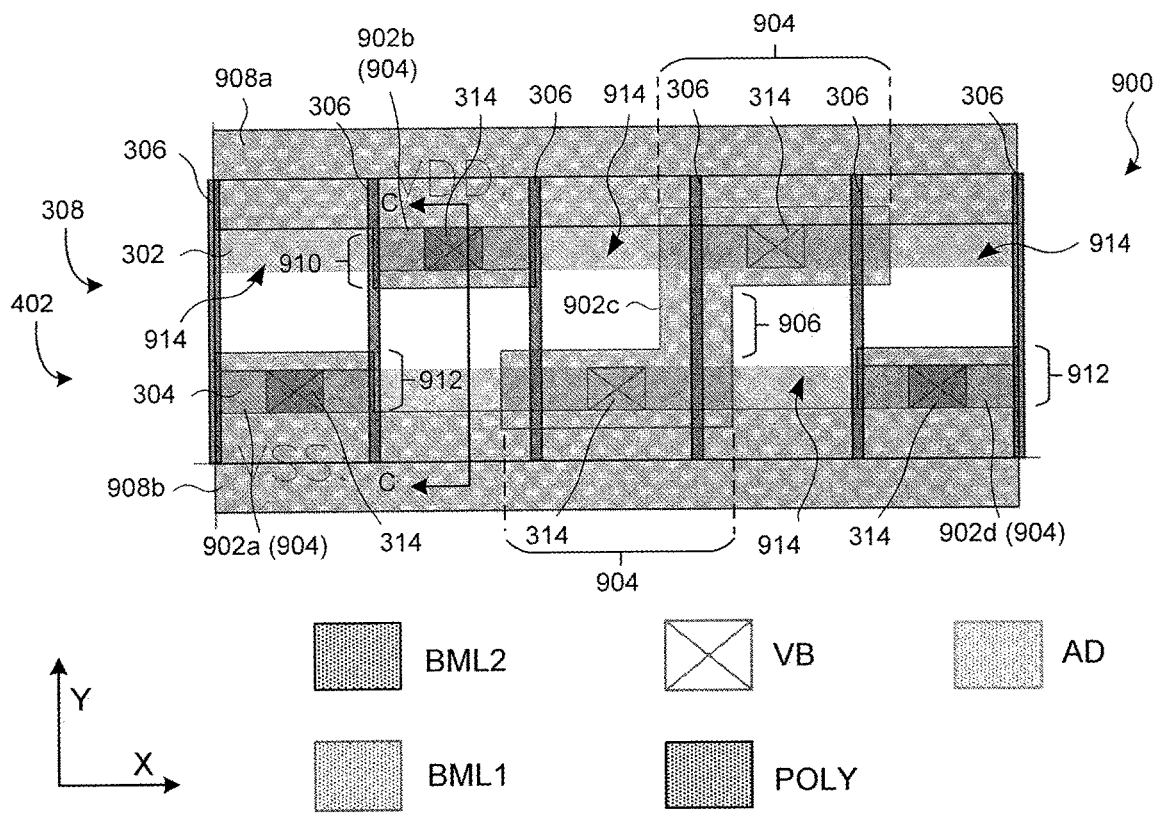
FIG. 9 depicts an example layout of a portion of a second integrated circuit in accordance with some embodiments.

FIG. 9 depicts a layout of a portion of a second integrated circuit in accordance with some embodiments. The layout 900 includes the first AD region 302 and the second AD region 304 formed in a backside of a substrate and disposed in the x direction. Gate lines 306 are disposed in the y direction over the first and the second AD regions 302, 304.

A BML1 layer 308 with conductive segments 902a, 902b, 902c, 902d is disposed over portions of the first AD region 302, the second AD region 304, and the gate lines 306. In the illustrated embodiment, first sections 904 of the conductive segments 902a through 902d are positioned in the x direction over the portions of the first and the second AD regions 302, 304 and the second section 906 of the conductive segment 902c is disposed in the y direction to connect two first sections 904 together.

Conductive vias (VB) 314 electrically connect some or all of the first sections 904 of the BML1 layer 308 to the first AD region 302 or to the second AD region 304. A second backside metal (BML2) layer 402 having conductive segments 908a, 908b is positioned in the x direction and over portions of the gate lines 306. Section 910 of the conductive segment 908a extends in they direction over a portion of the first AD region 302 and a portion of the BML1 layer 308. Sections 912 of the conductive segment 908b extend in they direction over portions of the second AD region 304 and portions of the BML1 layer 308. In the illustrated embodiment, the conductive segments 908a, 908b are configured to provide power signals from one or more voltage sources. For example, in one embodiment, the conductive segment 908a supplies a first voltage signal (e.g., a VDD signal) and the conductive segment 908b provides a second voltage signal (e.g., a VSS signal).

Figure 10:
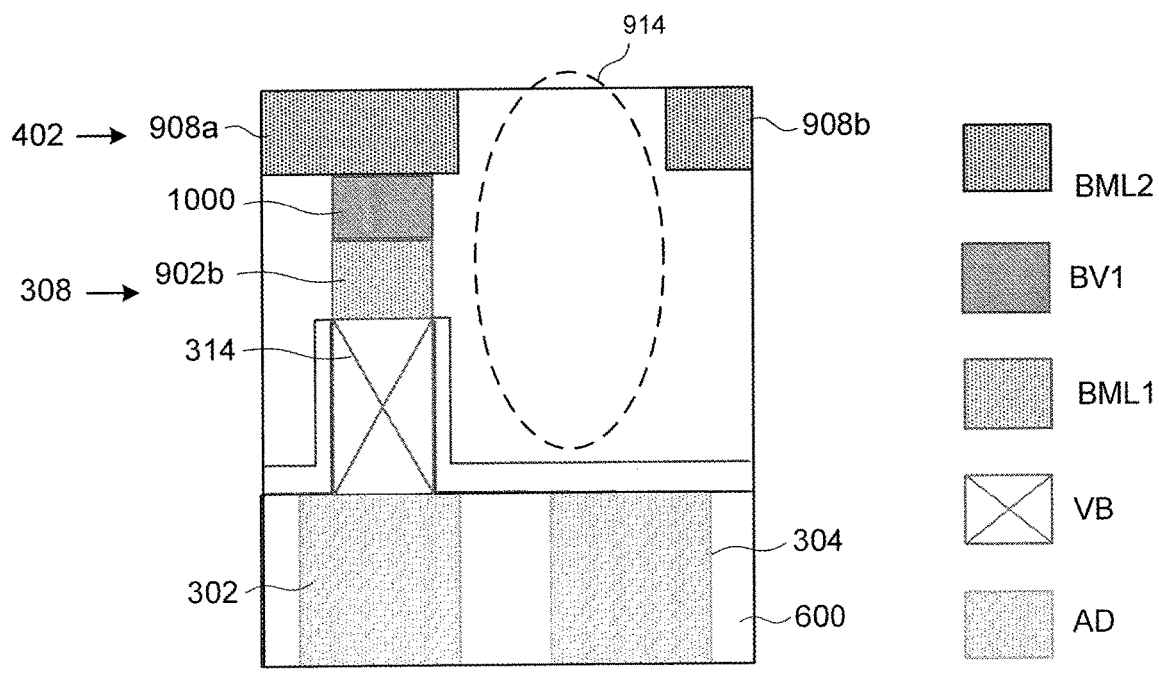
FIG. 10 illustrates a cross-sectional view of the second integrated circuit taken along line C-C in FIG. 9 in accordance with some embodiments.

The areas 914 of the backside of the substrate are not covered by any backside metal layers (e.g., BML1 layer 308 and BML2 layer 402) and are exposed and detectable, while other areas are covered by at least one backside metal layer (e.g., BML1 layer 308 or BML2 layer 402). An example area 914 is shown in FIG. 10. In the embodiment of FIG. 9, the power regions of a cell (e.g., VSS, VDD) are covered by the BML2 layer 402. Other regions of the cell (not the power regions) are included in the area 914 and are exposed and detectable. In a non-limiting example, portions of the substrate, portions of the first AD region 302, and portions of the second AD region 304 are exposed and detectable. A greater amount of the first and the second AD regions 302, 304 are exposed in the embodiment shown in FIG. 9 compared to the embodiment depicted in FIGS. 5 and 7. As such, an output signal as well as an internal signal of a cell can be detected in one or more testing or analyses procedures (e.g., a PFA).

FIG. 10 illustrates a cross-sectional view of the second integrated circuit taken along line C-C in FIG. 9 in accordance with some embodiments. As described earlier, the first and the second AD regions 302, 304 are formed in the backside of the substrate 600. A conductive via 1000 is formed between the BML2 layer 402 (e.g., conductive segment 908a) and the BML1 layer 308 (e.g., conductive segment 902b) to electrically connect the conductive segment 908a to the conductive segment 902b. The VB 314 is formed over the first AD region 302 and between the first AD region 302 and the conductive segment 902b of the BML1 layer 308. The VB 314 electrically connects the first AD region 302 to the conductive segment 902b.

The area 914 of the backside of the substrate is not covered by the BML2 layer 402 and is exposed and detectable. In this embodiment, regions of a cell except the power regions (e.g., VDD, VSS) are included in the area 914 and are exposed and detectable. The power regions (e.g., VSS, VDD) are covered by the BML1 layer 308 and/or the BML2 layer 402. As shown in FIG. 10, the second AD region 304 is one of the regions that is exposed and detectable.

Figure 11:
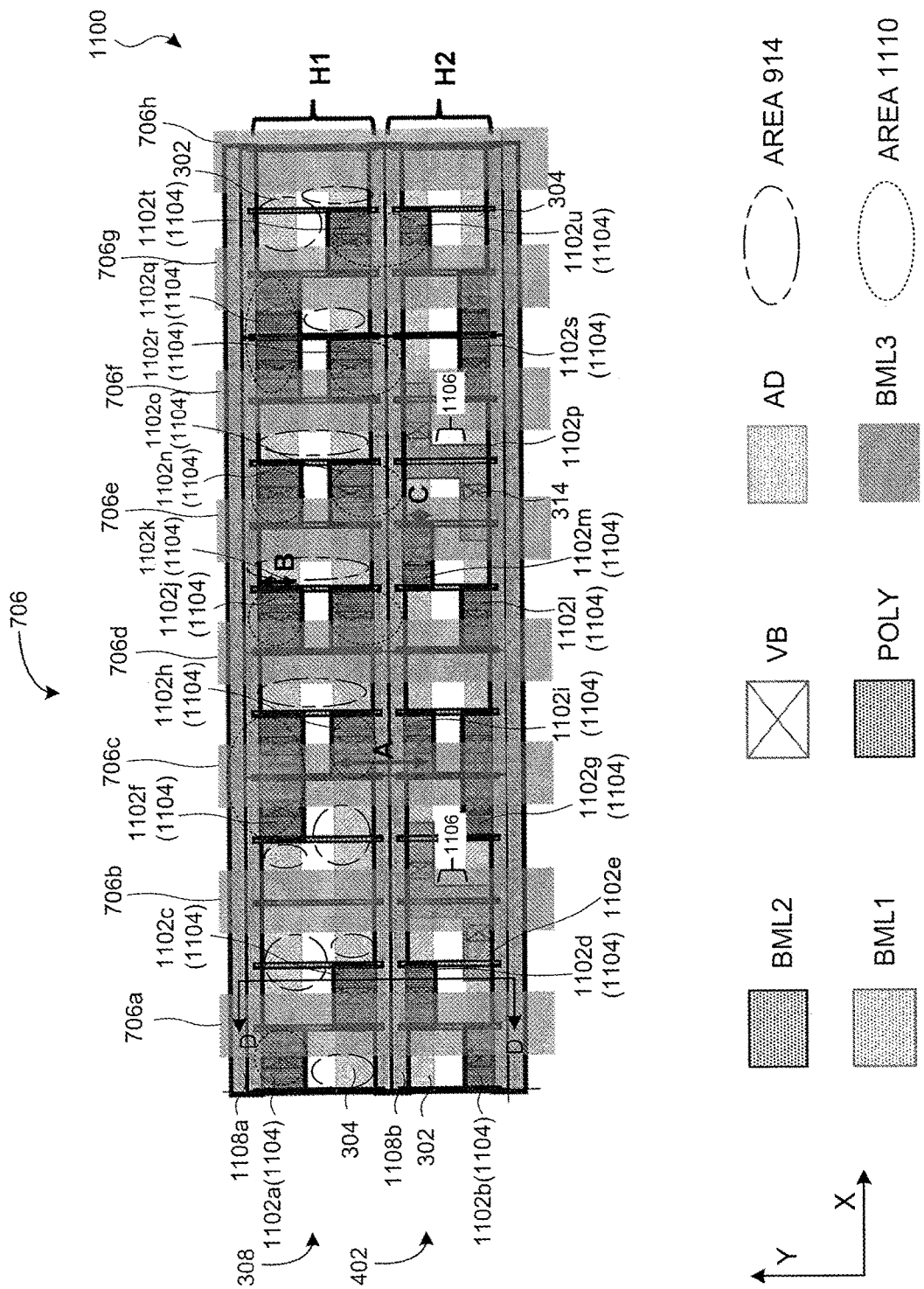
FIG. 11 depicts an example layout of the portion of the second integrated circuit shown in FIG. 9 along with a third backside metal layer in accordance with some embodiments.

FIG. 11 depicts an example layout of the portion of the second integrated circuit shown in FIG. 9 along with a third backside metal layer in accordance with some embodiments. The layout 1100 includes the first AD region 302 and the second AD region 304 formed in a backside of a substrate and disposed in the x direction. The gate lines 306 are positioned in the y direction over the first and the second AD regions 302, 304. The BML1 layer 308 with conductive segments 1102a through 1102u are disposed over portions of the first AD region 302, the second AD region, and the gate lines 306. In the illustrated embodiment, the first sections 1104 of the conductive segments 1102a through 1102u are positioned in the x direction over the portions of the first AD region 302, the second AD region 304, and the gate lines 306. Second sections 1106 of the conductive segments 1102e, 1102p are disposed in the y direction to connect two first sections 1104 together.

The BML2 layer 402 includes conductive segments 1108a, 1108b, 1108c that are positioned in the x direction adjacent the first and the second AD regions 302, 304 and over portions of the gate lines 306. The BML2 layer 402 is formed over the BML1 layer 308. Like the embodiment shown in FIG. 9, sections of the conductive segments 1108a, 1108b, 1108c extend in the y direction over select portions of the first AD region 302, the second AD region 304, and the BML1 layer 308. For clarity, the sections are not identified in FIG. 11.

In the illustrated embodiment, the conductive segments 1102a, 1102b, 1102c are configured to provide power signals from one or more voltage sources to some or all of the cells in an IC. For example, in one embodiment, the conductive segments 1102a, 1102c supply a first voltage signal (e.g., a VDD signal) and the conductive segment 1102b provides a second voltage signal (e.g., a VSS signal).

A third backside metal (BML3) layer 706 with conductive segments 706a through 706h is disposed in the y direction over portions of the first AD region 302, the second AD region 304, the gate lines 306, the BML1 layer 308, and the BML2 layer 402. The BML3 layer 706 is formed over the BML2 layer 402. In one embodiment, the conductive segments 706a through 706h are configured to transmit data signals.

As described in conjunction with FIGS. 9 and 10, the areas 914 of the backside of the substrate are not covered by any backside metal layer (e.g., BML1 308, BML2 402, and BML3 706) and are exposed and detectable. The areas 914 include areas of the cell other than the power regions. Additionally, areas 1110 of the first and the second AD regions 302, 304 are covered by at least one backside metal layer (e.g., the BML1 layer 308, the BML2 layer 402, and/or the BML3 layer 706). In some embodiments, the areas 1110 include the output regions and the source and/or the drain regions of the cells. As such, an output signal of the cells as well as internal signals of the cells can be detected in one or more testing or analyses procedures (e.g., a PFA). For clarity, only select areas 914 and 1110 are identified in FIG. 11.

In a non-limiting nonexclusive embodiment, the minimum spacing between the BML1 layer 308 and the BML2 layer 402 is approximately eighteen (18) nm and the minimum width of the BML1 layer 308 is approximately twenty-four (24) nm. The lengths A, B, and C are approximately sixty-three (63) nm, twenty-four (24) nm, and fifteen (15) nm, respectively. The height H1 is approximately ninety (90) nm with a pitch of four metal lines in the BML1 layer 308 (e.g., 4M0) and the height H2 is approximately seventy-two (72) nm with a pitch of three metal lines in the BML1 layer 308 (e.g., 3M0).

Figure 12:
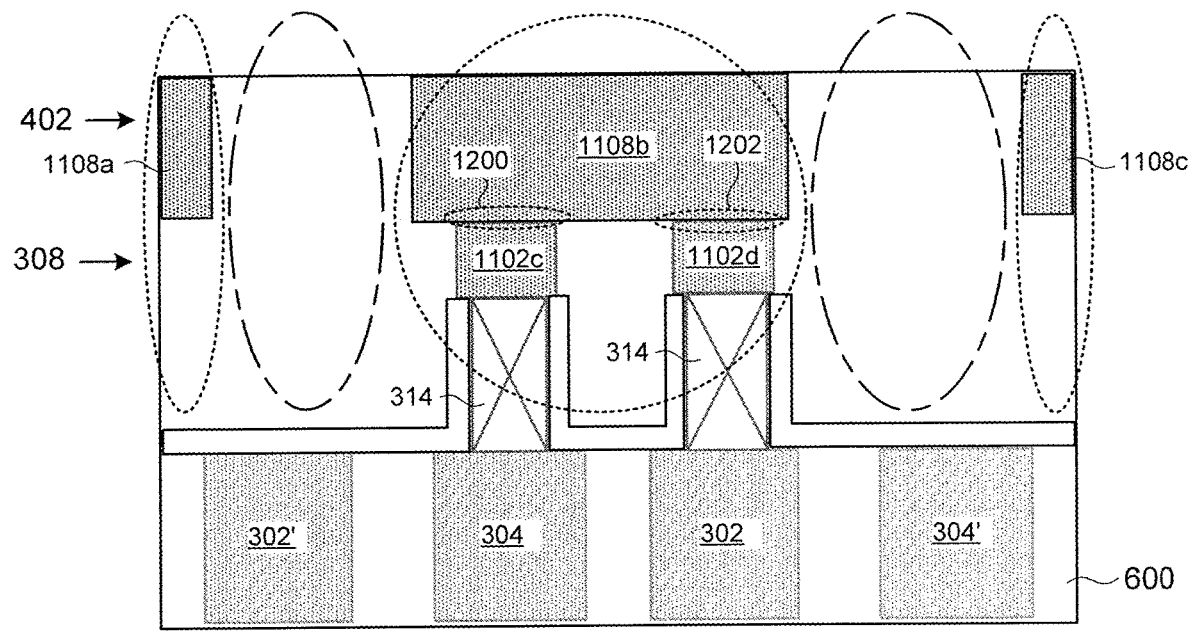
FIG. 12 illustrates a cross-sectional view of the second integrated circuit taken along line D-D in FIG. 11 in accordance with some embodiments.

FIG. 12 illustrates a cross-sectional view of the second integrated circuit taken along line D-D in FIG. 11 in accordance with some embodiments. The first and the second AD regions 302, 304 are formed in the backside of the substrate 600. A VB 314 is formed over one of the second AD regions 304 and between the second AD region 304 and the BML1 layer 308 (e.g., conductive segment 1102c). Another VB 314 is formed over one of the first AD regions 302 and between the first AD region 302 and the BML1 layer 308 (e.g., conductive segment 1102d). The VBs 314 electrically connect the first and the second AD regions 302, 304 to the conductive segments 1102d, 1102c, respectively. The BML2 layer 402 (e.g., conductive segment 1108b) directly contacts the conductive segments 1102c, 1102d of the BML1 layer at areas 1200, 1202.

The areas 914 of the backside of the substrate are not covered by any backside metal layer (e.g., the BML1 layer 308 and/or the BML2 layer 402) and are exposed and detectable. Again, in this embodiment, the regions of a cell except the power regions (e.g., VDD, VSS) are included in the areas 914. The power regions (e.g., VSS, VDD) are covered by the BML1 layer 308 and/or the BML2 layer 402. As shown in FIG. 12, the first AD region 302' and second AD region 304' are regions that are exposed and detectable.

In some embodiments, one or more of the layouts for the BML2 layer are used in conjunction with a layout for a first frontside metal (FML1) layer. In a non-limiting nonexclusive example, the FML1 layer is an FM0 layer. In one embodiment, one or more contacts can be formed between the FML1 layer and the BML1 layer.

Figure 13:
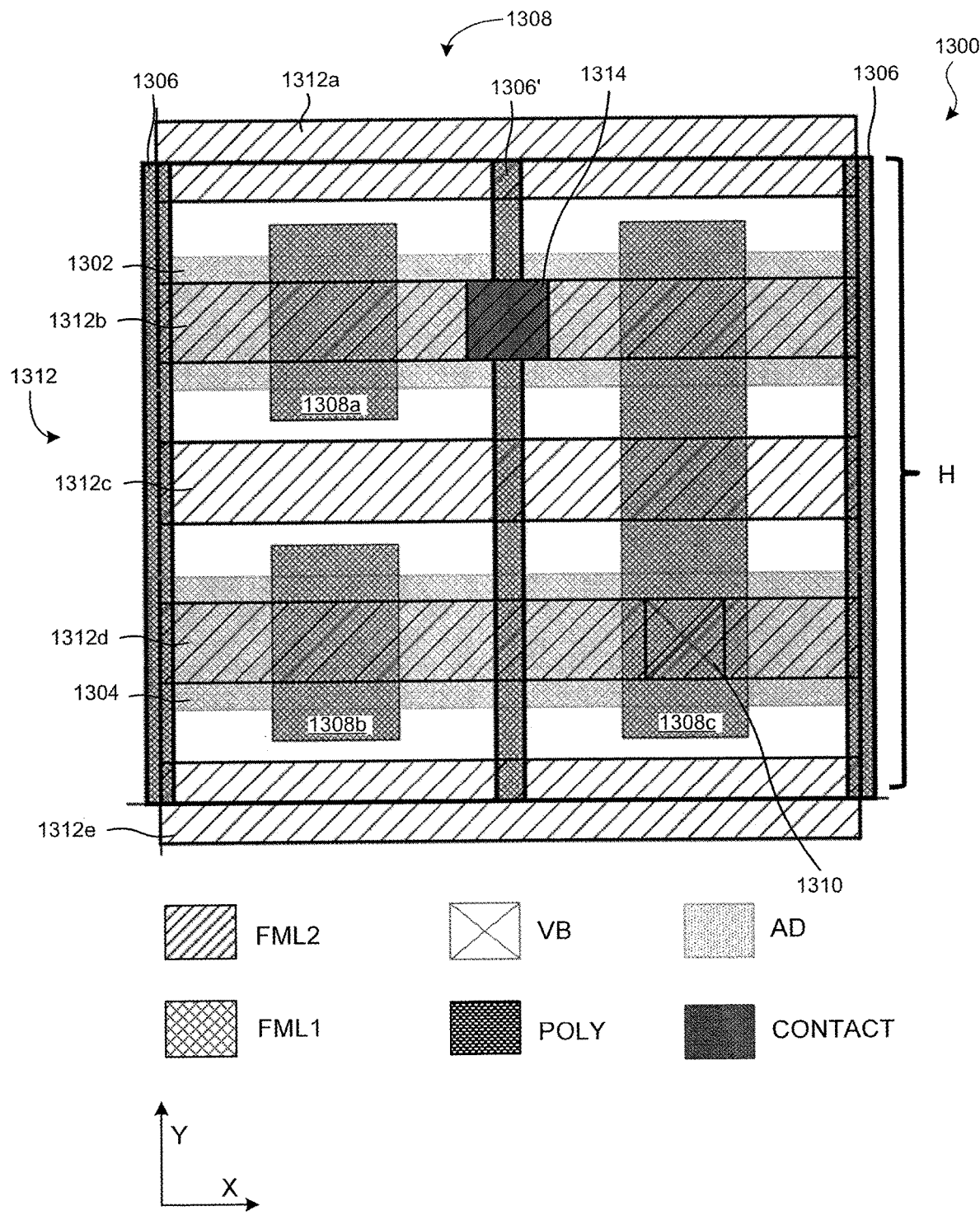
FIG. 13 depicts an example layout of a portion of a first integrated circuit in accordance with some embodiments.

FIG. 13 depicts an example layout of a portion of a first integrated circuit in accordance with some embodiments. The layout 1300 includes a first AD region 1302 and a second AD region 1304 disposed in the x direction. Gate lines 1306 are disposed in the y direction over the first and the second AD regions 1302, 1304. A FML1 layer 1308 with conductive segments 1308a, 1308b, 1308c is disposed in the y direction over portions of the first and the second AD regions 1302, 1304.

Conductive vias (VB) 1310 electrically connect some or all of the FML1 layer 1308 to the first AD region 1302 or to the second AD region 1304. In the illustrated embodiment, a VB 1310 electrically connects the conductive segment 1308c of the FML1 layer 1308 to the second AD region 1304.

A second frontside metal (FML2) layer 1312 having conductive segments 1312a through 1312e is positioned in the x direction over portions of the first AD region 1302, the second AD region 1304, the gate lines 1306, and the FML1 layer 1308. A contact 1314 electrically connects the conductive segment 1312b of the FML2 layer 1312 to the gate line 1306'. In one embodiment, the layout 1300 is a (3+3FML1) layout that has a height (H) of approximately seventy-two (72) nm. The (3+3 FML1) refers to the pitch of three metal layers in both the BML1 layer and the FML1 layer (e.g., 3BM0 and 3FM0).

Figure 14:
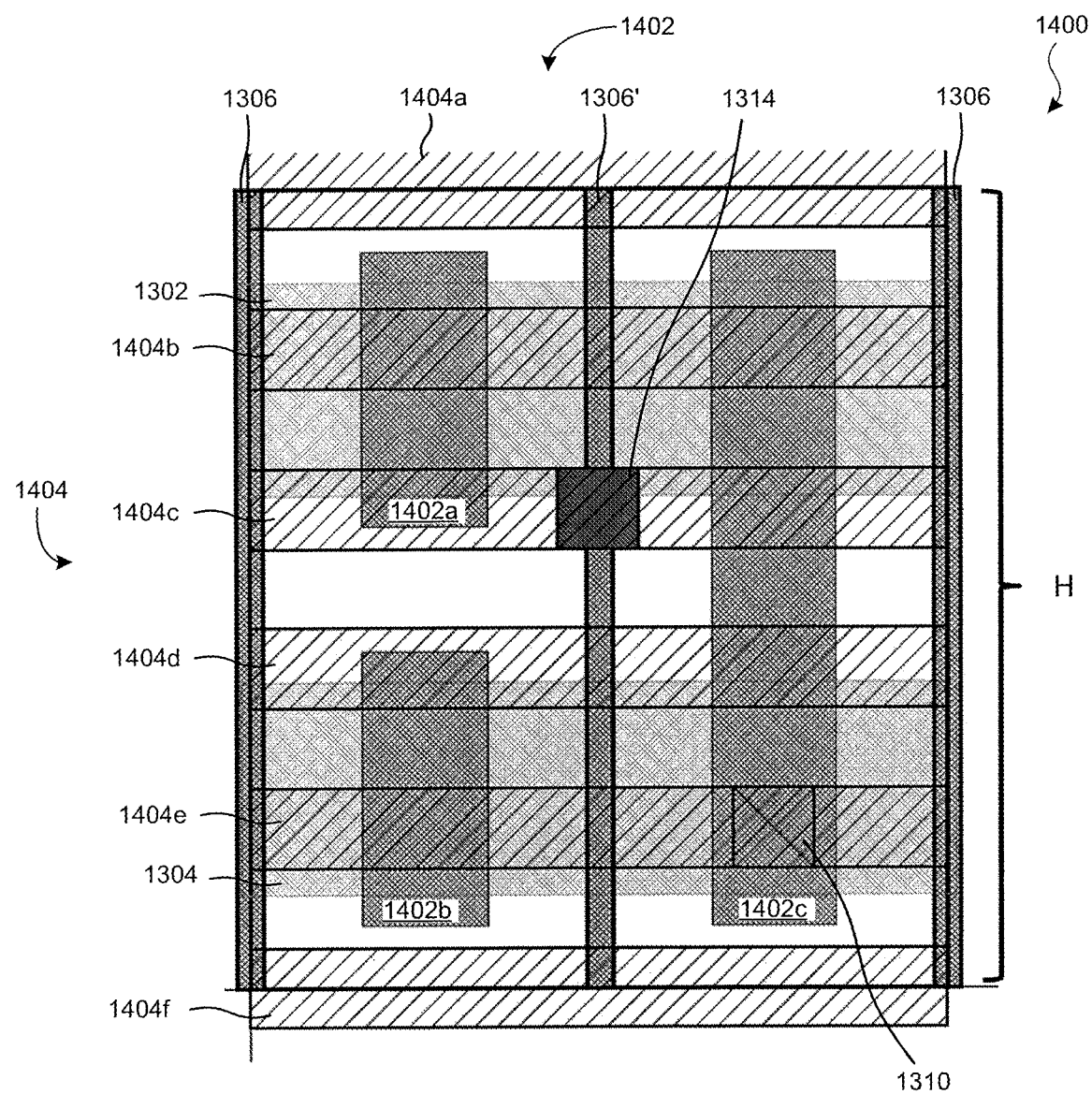
FIG. 14 illustrates an example layout of a portion of a second integrated circuit in accordance with some embodiments.

FIG. 14 illustrates an example layout of a portion of a second integrated circuit in accordance with some embodiments. The layout 1400 includes the first AD region 1302 and the second AD region 1304 disposed in the x direction. Gate lines 1306 are disposed in the y direction over the first and the second AD regions 1302, 1304. A FML1 layer 1402 with conductive segments 1402a, 1402b, 1402c is disposed in they direction over portions of the first and the second AD regions 1302, 1304.

Conductive vias (VB) electrically connect some or all of the FML1 layer 1402 to the first AD region 1302 or to the second AD region 1304. In the illustrated embodiment, a VB 1310 electrically connects the conductive segment 1402c of the FML1 layer 1402 to the second AD region 1304.

A second frontside metal (FML2) layer 1404 having conductive segments 1404a through 1404f is positioned in the x direction over portions of the first AD region 1302, the second AD region 1304, the gate lines 1306, and the FML1 layer 1402. A contact 1314 electrically connects the conductive segment 1404c of the FML2 layer 1404 to the gate line 1306'. In one embodiment, the layout 1400 is a (3+4FML1) layout (e.g., 3+4M0) that has a height (H) of approximately ninety (90) nm.

Figure 15:
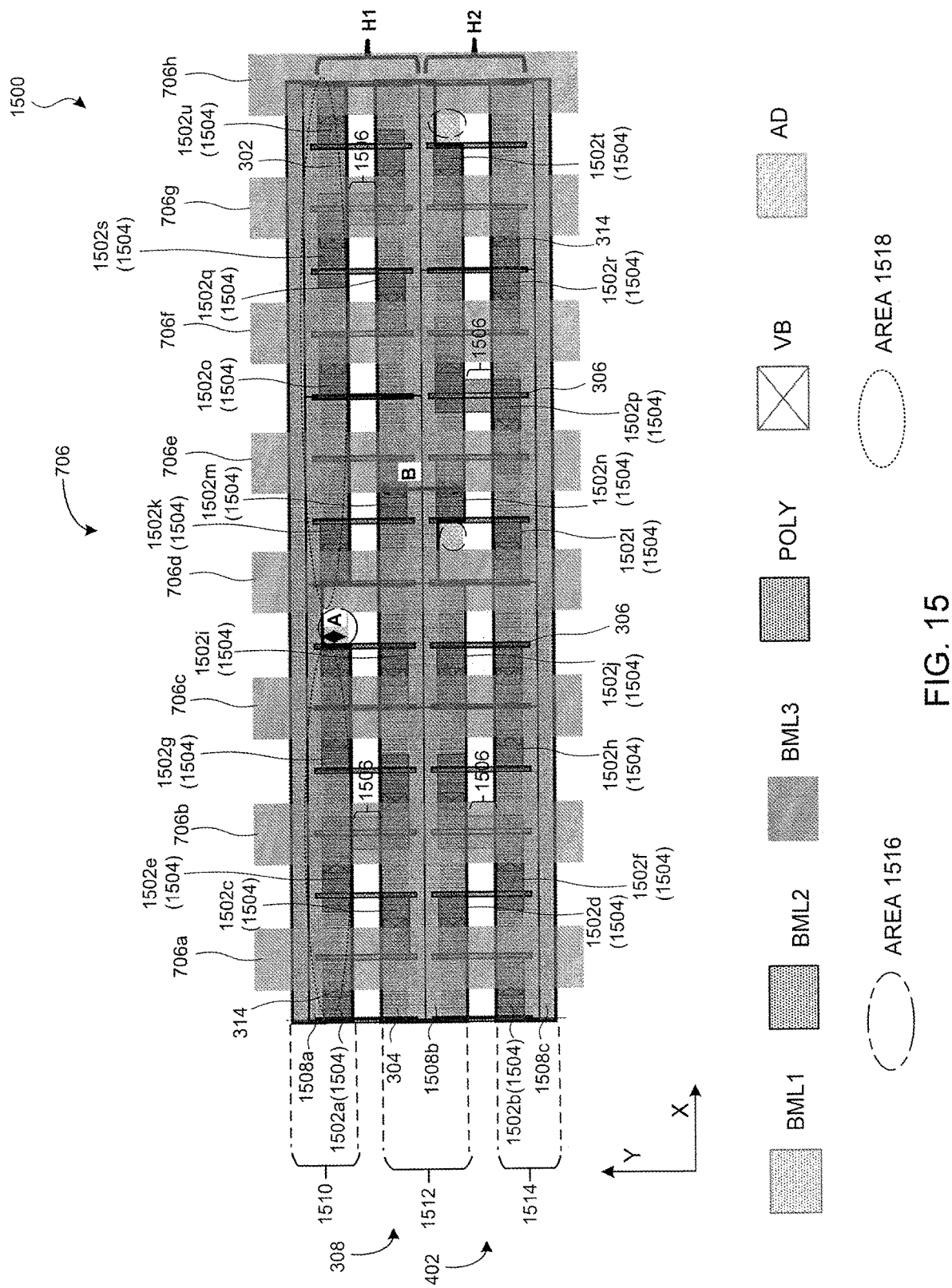
FIG. 15 depicts an example layout of a portion of a third integrated circuit in accordance with some embodiments.

FIG. 15 depicts an example layout of a portion of a third integrated circuit in accordance with some embodiments. The layout 1500 is a layout for backside metal layers, such as the BML1 layer, the BML2 layer, and the BML3 layer. The layout 1500 includes the first AD region 302 and the second AD region 304 formed in a backside of a substrate and disposed in the x direction. Gate lines 306 are disposed in the y direction over the first and the second AD regions 302, 304. A BML1 layer 308 with conductive segments 1502a through 1502u is disposed over portions of the first AD region 302, the second AD region 304, and the gate lines 306. In the illustrated embodiment, first sections 1504 of the conductive segments 1502a through 1502u are positioned in the x direction over the portions of the first and the second AD regions 302, 304 and second sections 1506 of the conductive segments 1502e, 1502f, 1502p, 1502s are disposed in the y direction to connect two first sections 1504 together.

Conductive vias (VB) 314 electrically connect some or all of the first sections 1504 of the BML1 layer 308 to the first AD region 302 or to the second AD region 304. A second backside metal (BML2) layer 402 having conductive segments 1508a, 1508b, 1508c is positioned in the x direction and over portions of the gate lines 306. In the illustrated embodiment, the conductive segments 1508a, 1508b, 1508c are configured to provide power signals from one or more voltage sources to some or all of the cells in an IC. For example, in one embodiment, the conductive segments 1508a, 1508c supply a first voltage signal (e.g., a VDD signal) and the conductive segment 1508b provides a second voltage signal (e.g., a VSS signal).

Sections 1510 of the conductive segment 1508a extend in they direction over a portion of the gate lines 306, a portion of the first AD region 302, and over portions of the BML1 layer 308 (e.g., the first sections 1504 of the conductive segments 1502a, 1502e, 1502g, 1502k, 1502o, 1502s, and 1502u).

Sections 1512 of the conductive segment 1508b extends in they direction towards and over portions of the gate lines 306, over portions of the second AD region 304, and over portions of the BML1 layer 308 (e.g., first sections 1504 of the conductive segments 1502c, 1502d, 1502e (the first section 1504 over the second AD region 304), 1502f (the first section 1504 over the second AD region 304), 1502i, 1502j, 1502m, 1502n, 1502p (the first section 1504 over the first AD region 302), 1502q, 1502s (the first section 1504 over the second AD region 304), and 1502t).

Sections 1514 of the conductive segment 1508c extends in the y direction towards and over portions of the gate lines 306, over the second AD region 304, and over portions of the BML1 layer 308 (e.g., the first sections 1504 of the conductive segments 1502b, 1502f (the first section 1504 over the second AD region 304), 1502h, 15021, 1502p (the first section 1504 over the second AD region 304), and 1502r).

A third backside metal (BML3) layer 706 with conductive segments 706a through 706h is disposed in they direction over portions of the first AD region 302, the second AD region 304, the gate lines 306, the BML1 layer 308, and the BML2 layer 402. The BML3 layer 706 is formed over the BML2 layer 402. In one embodiment, the conductive segments 706a through 706h are configured to transmit data signals.

The areas 1516 of the backside of the substrate are not covered by any backside metal layer (e.g., the BML1 layer 308, the BML2 layer 402, and the BML3 layer 706) and are therefore exposed and detectable. In the illustrated embodiments, a portion of the first AD region 302 in area 1516 and portions of the first AD region 302 in areas 1518 are exposed and detectable. The areas 1518 are covered by at least one backside metal layer (e.g., the BML1 layer 308, the BML2 layer 402, and/or the BML3 layer 706). For clarity, only select areas 1518 are identified in FIG. 15.

In a non-limiting nonexclusive embodiment, the minimum spacing between the BML1 layer 308 and the BML2 layer 402 is approximately eighteen (18) nm, the minimum width of the BML1 layer 308 is approximately twenty-four (24) nm, and the BML1 pitch is approximately seventy-two (72) nm. The lengths A and B are approximately fifteen (15) nm and fifty-four (54) nm, respectively. The heights H1 and H2 are approximately seventy-two (72) nm with a pitch of three metal lines in the BML1 layer 308 (e.g., 3M0). In some instances, the pitch of three metal lines for the entire BML1 layer 308 can reduce the area of the chip or die that is used by the BML1 layer 308.

Figure 16:
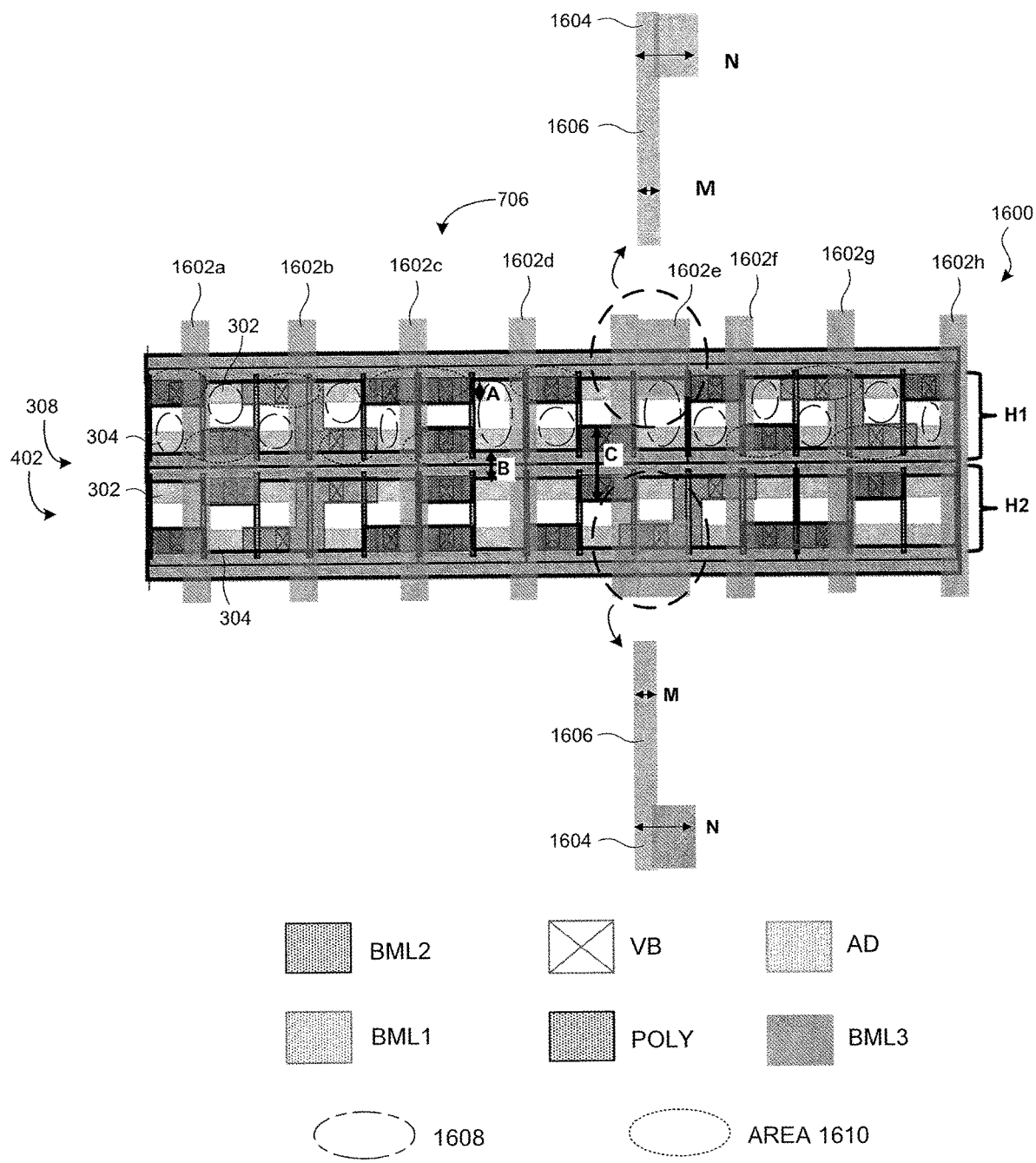
FIG. 16 illustrates an example layout of a portion of a fourth integrated circuit in accordance with some embodiments.

FIG. 16 illustrates an example layout of a portion of a fourth integrated circuit in accordance with some embodiments. The layout 1600 is a layout for backside metal layers, such as the BML1 layer, the BML2 layer, and the BML3 layer. The layout 1600 includes the first AD region 302 and the second AD region 304 formed in a backside of a substrate and disposed in the x direction. Gate lines 306 are disposed in the y direction over the first and the second AD regions 302, 304. A BML1 layer 308 is disposed over portions of the first AD region 302, the second AD region 304, and the gate lines 306. In the illustrated embodiment, the BML1 layer 308 is configured as the BML1 layer 308 shown in FIG. 15. For brevity, the BML1 layer 308 in FIG. 16 is not discussed in more detail.

A BML2 layer 402 is formed over the BML1 layer 308. The BML2 layer 402 in FIG. 16 is configured as the BML2 layer 402 shown in FIG. 11. Again, for brevity, the BML2 layer 402 in FIG. 16 is not discussed in more detail.

A third backside metal (BML3) layer 706 with conductive segments 1602a through 1602h is disposed in they direction over portions of the first AD region 302, the second AD region 304, the gate lines 306, the BML1 layer 308, and the BML2 layer 402. In the illustrated embodiment, the sections 1604 of the conductive segment 1602e are longer in the y direction and wider in the x direction compared to the middle section 1606 of the conductive segment 1602*e* (e.g., sections 1604 at top and bottom of conductive segment 1602*e*). The sections 1604 have a larger area compared to an area of the middle section 1606. In a non-limiting nonexclusive example, the width N of the sections 1604 is thirty (30) to sixty (60) nm and the width M of the section 1606 is fifteen (15) to thirty-five nm. The increased width N enables a contact to be formed between one or both of the sections 1604 of the BML3 layer 706 and the BML1 layer 308. The larger area of the section 1604 of the BML3 layer 706 can improve or optimize the capacitance and/or the resistance of the contact.

In FIG. 16, the areas 1608 of the backside of the substrate are not covered by any backside metal layer (e.g., the BML1 layer 308, the BML2 layer 402, and the BML3 layer 706) and are therefore exposed and detectable. In the illustrated embodiments, portions of the first AD region 302 and portions of the second AD region 304 are exposed and detectable. The areas 1610 are covered by at least one backside metal layer (e.g., the BML1 layer 308, the BML2 layer 402, and/or the BML3 layer 706). For clarity, only select areas 1608, 1610 are identified in FIG. 16.

In a non-limiting nonexclusive embodiment, the minimum spacing between the BML1 layer 308 and the BML2 layer 402 is approximately eighteen (18) nm and the minimum width of the BML1 layer 308 is approximately twenty-four (24) nm. The lengths A, B, and C are approximately fifteen (15) nm, twenty-four (24) nm, and fifty-four (54) nm, respectively. The heights H1 and H2 are approximately seventy-two (72) nm with a pitch of three metal lines in the BML1 layer 308 (e.g., 3M0).

Figure 17:
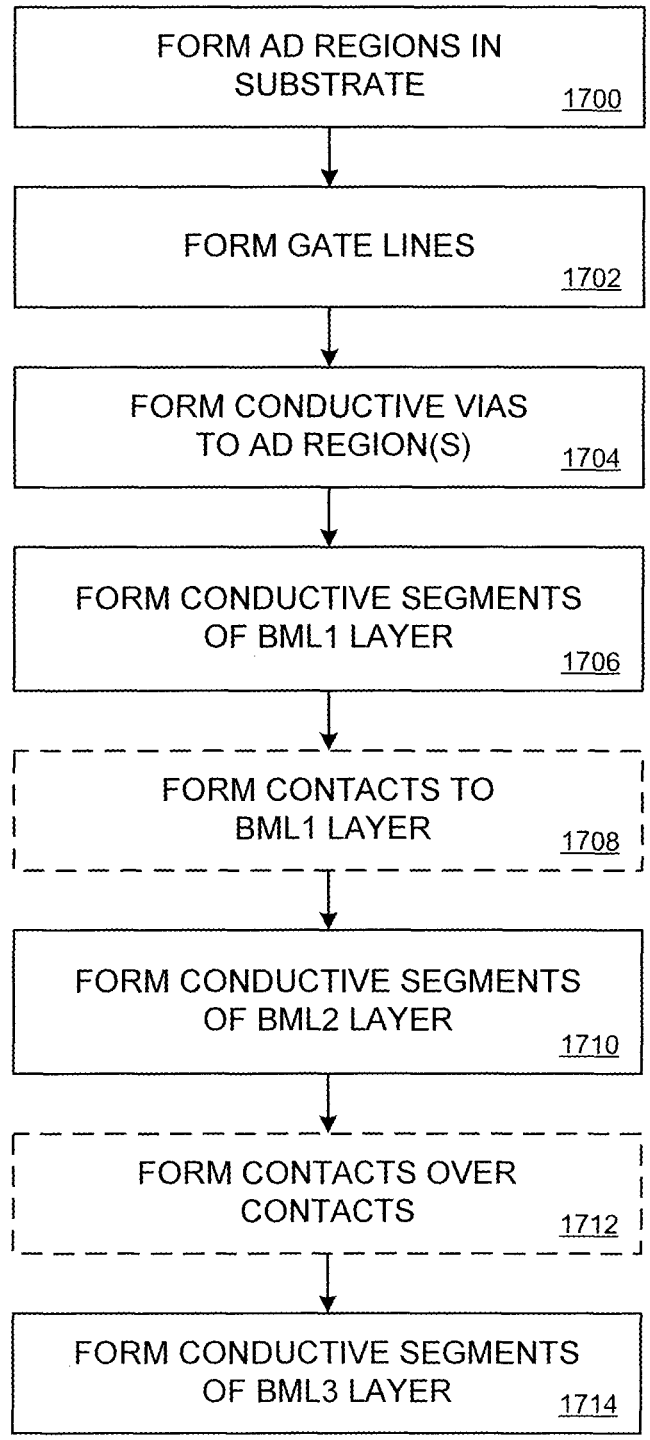
FIG. 17 depicts a flowchart of a method of fabricating an integrated circuit in accordance with some embodiments.

FIG. 17 depicts a flowchart of a method of fabricating an integrated circuit in accordance with some embodiments. Initially, as shown in block 1700, one or more AD regions are formed in a backside of a substrate. In a non-limiting example, dopants of n-type and p-type conductivity are implanted into the areas of the backside of the substrate where the AD regions are to be formed. Dopants having an n-type conductivity include, but are not limited to, phosphorus, arsenic, and antimony. Dopants having a p-type conductivity include, but are not limited to, boron, gallium, and indium.

The gate lines are formed over the backside of the substrate at block 1702. One technique for forming the gate lines includes forming a mask layer over the backside of the substrate and patterning the mask layer to include openings where the gate lines will be formed. A polysilicon material or other conductive material is formed (e.g., deposited) in the openings. The mask layer is then removed.

One or more conductive vias are formed over the AD region(s) at block 1704. As discussed previously, one technique for forming the conductive vias includes forming a mask layer over the substrate and patterning the mask layer to include openings where the one or more conductive vias will be formed. A conductive material is formed (e.g., deposited) in the openings. The mask layer is then removed, and an insulating material is formed around the conductive vias to electrically isolate the conductive vias.

Next, as shown in block 1706, the conductive segments of a BML1 layer are formed over the IC. One technique for forming the conductive segments of the BML1 layer includes forming a mask layer over the substrate and the gate lines and patterning the mask layer to include openings where the conductive segments will be formed. A conductive material is formed (e.g., deposited) in the openings and the mask layer is removed. An insulating material is formed over and around the conductive segments to electrically isolate the conductive segments.

One or more contacts to the BML1 layer are formed at optional block 1708. The one or more contacts will eventually electrically connect select conductive segments of the BML1 layer to particular conductive segments in a BML3 layer. One technique for forming the contacts includes forming a mask layer over the IC and patterning the mask layer to include openings where the contacts will be formed. A conductive material is formed (e.g., deposited) in the openings and the mask layer is removed. An insulating material is formed around the contacts to electrically isolate the contacts.

Next, as shown in block 1710, the conductive segments of a BML2 layer are formed over the IC (block 1708). The conductive segments are formed to cover only one or more portions of the backside of the substrate, thereby exposing one or more areas of the backside of the substrate. One technique for forming the conductive segments of the BML2 layer is similar to the process described in conjunction with block 1706. One or more contacts to the contacts form at optional block 1708 are formed at optional block 1712. As discussed earlier, the one or more contacts will eventually electrically connect select conductive segments of the BML1 layer to particular conductive segments in a BML3 layer. A technique for forming the contacts is similar to the process described in conjunction with block 1708.

The conductive segments of a BML3 layer are formed over the IC at block 1714. For example, the conductive segments can be aligned to the gate lines. In embodiments where contacts were formed at the optional blocks 1708, 1712, select conductive segments of the BML3 layer contact the contacts to electrically connect the BML1 layer to the BML3 layer. One technique for forming the conductive segments of the BML3 layer includes forming a mask layer over the IC and patterning the mask layer to include openings where the conductive segments will be formed. In embodiments where one or more of the conductive segments are formed with larger sections at the top and/or the bottom section(s) of the conductive segments (see FIG. 16), the mask layer is patterned to have the larger sections at the top and/or the bottom section(s). A conductive material is formed (e.g., deposited) in the openings and the mask layer is removed. An insulating material is formed around the conductive segments to electrically isolate the conductive segments.

When the fabrication process is complete, areas of the backside of the substrate are not covered by any backside metal layer and are exposed and detectable. For example, after block 1714 is performed, areas of the backside of the substrate are not covered by the BML1 layer, the BML2 layer, and the BML3 layer. The exposed areas enable one or more testing procedures to detect one or more signals in the cells.

Figure 18:
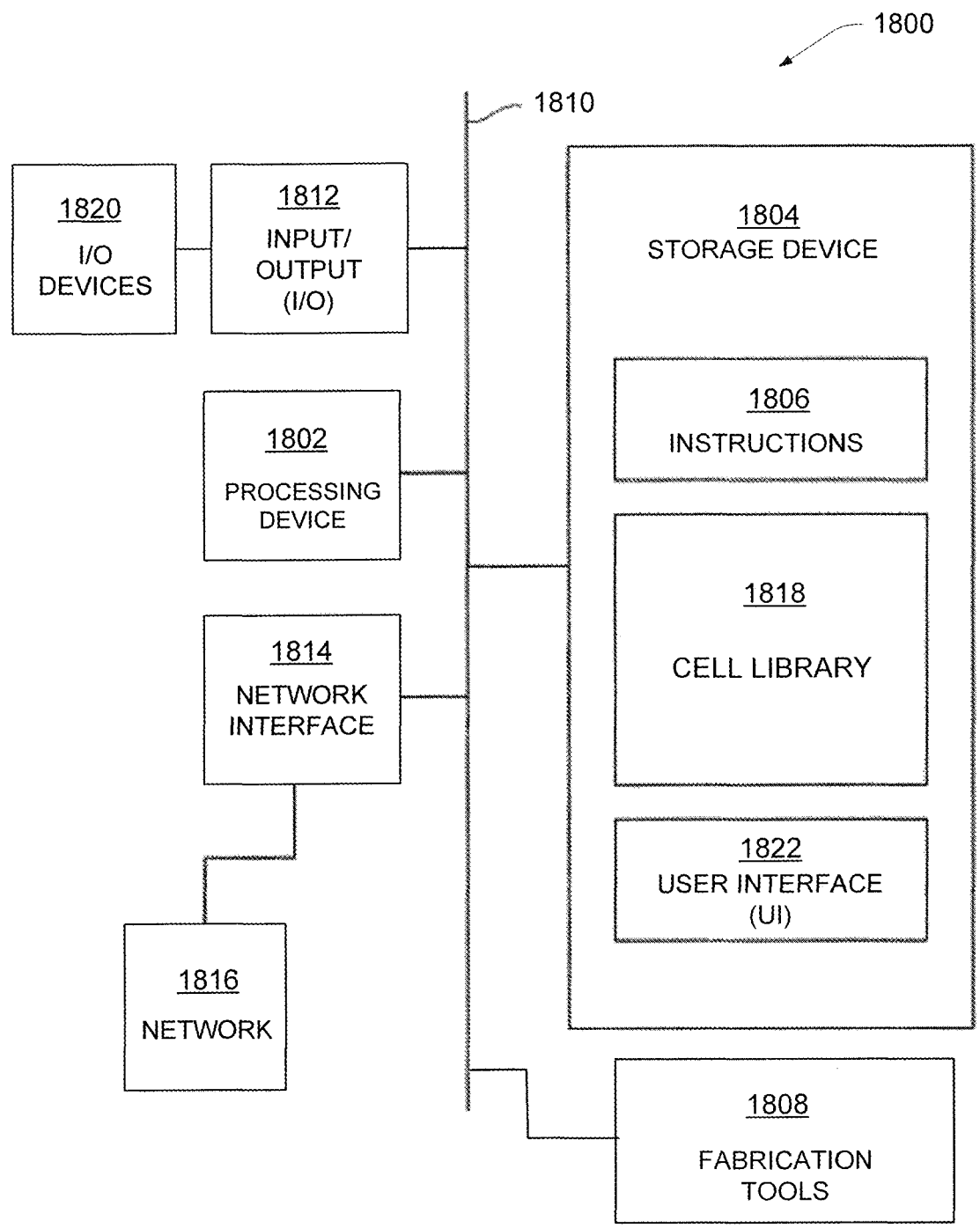
FIG. 18 illustrates an example system that is suitable for designing an integrated circuit in accordance with some embodiments.

FIG. 18 illustrates an example system that is suitable for designing an integrated circuit in accordance with some embodiments. The design process may be implemented by a computer system, such as an ECAD system. Some or all of the operations for design (e.g., layout) methods disclosed herein are capable of being performed as part of a design procedure performed in a design house, such as the design house 1902 discussed below in conjunction with FIG. 19.

In some embodiments, the system 1800 includes an automated place and route (APR) system. In some embodiments, the system 1800 includes a processing device 1802 and a non-transitory, computer-readable storage medium 1804 ("storage device"). The processing device 1802 is any suitable processing device or processing devices. Example processing devices include, but are not limited to, a central processing unit, a microprocessor, a distributed processing system, an application specific integrated circuit, a graphics processing unit, a field programmable gate array, or combinations thereof.

The storage device 1804 may be encoded with or store, for example, computer program code (e.g., a set of executable instructions 1806). Execution of the executable instructions 1806 by the processing device 1802 represents (at least in part) an ECAD tool that implements a portion or all of, the methods described herein to produce the designs for the structures and the ICs disclosed herein. Further, the fabrication tools 1808 may be included for layout and physical implementation of the ICs. In one or more embodiments, the storage device 1804 is an electronic, magnetic, optical, electromagnetic, infrared, and/or a semiconductor system (or apparatus or device). For example, the storage device 1804 includes a semiconductor or solid-state memory, a magnetic tape, a removable computer diskette, a random-access memory (RAM), a read-only memory (ROM), a rigid magnetic disk, and/or an optical disk. In one or more embodiments using optical disks, the storage device 1804 includes a compact disk-read only memory (CD-ROM), a compact disk-read/write (CD-R/W), and/or a digital video disc (DVD).

The processing device 1802 is operably connected to the storage device 1804 via a bus 1810. The processing device 1802 is also operably connected to an input/output (I/O) interface 1812 and a network interface 1814 by the bus 1810. The network interface 1814 is operably connected to a network 1816 so that the processing device 1802 and the storage device 1804 are capable of connecting to external elements via the network 1816. In one or more embodiments, the network 1816 is illustrative of any type of wired and/or wireless network, such as an intranet and/or a distributed computing network (e.g., the Internet).

The network interface 1814 allows the system 1800 to communicate with other computing or electronic devices (not shown) via the network 1816. The network interface 1814 includes wireless network interfaces and/or wired network interfaces. Example wireless network interfaces include BLUETOOTH, WIFI, WIMAX, GPRS, or WCDMA. Example wired network interfaces include ETHERNET, USB, or IEEE-1364. In one or more embodiments, some or all of the processes and/or methods disclosed herein are implemented in a distributed system via the network 1816.

The processing device 1802 is configured to execute the executable instructions 1806 encoded in the storage device 1804 to cause the system 1800 to be usable for performing some or all of the processes and/or methods. For example, an electronic design application (e.g., in an ECAD system or as a standalone application) can be configured to perform the methods and techniques shown in FIGS. 1-17.

In one or more embodiments, the storage device 1804 stores the executable instructions 1806 configured to cause the system 1800 to be usable for performing some or all of the processes and/or methods. In one or more embodiments, the storage device 1804 also stores information that facilitates execution of a portion of or all of the processes and/or methods. In one or more embodiments, the storage device 1804 stores a cell library 1818 that includes (at least in part) standard and/or previously designed cells.

The I/O interface 1812 is operably connected to I/O devices 1820. In one or more embodiments, the I/O devices 1820 include one or more of an image capture device, a microphone, a scanner, a keyboard, a keypad, a mouse, a trackpad, a touchscreen, and/or cursor direction keys for communicating information and commands to the processing device 1802. The I/O devices 1820 may also include one or more displays, one or more speakers, a printer, headphones, a haptic or tactile feedback device, and the like.

The system 1800 is configured to receive information through the I/O interface 1812. The information received through the I/O interface 1812 includes one or more of instructions, data, design rules, cell libraries, and/or other parameters for processing by the processing device 1802. The information is transferred to the processing device 1802 via the bus 1810. The system 1800 is configured to receive information related to a user interface (UI) through the I/O interface 1812. The information is stored in the storage device 1804 as a UI 1822 or for presentation in the UI 1822.

In some embodiments, a portion or all of the processes and/or methods is implemented as a standalone software application (e.g., an EDA) for execution by a processing device (e.g., processing device 1802). In some embodiments, a portion or all of the processes and/or methods is implemented as a software application that is a part of an additional software application. In some embodiments, a portion or all of the processes and/or methods is implemented as a plug-in to a software application. In some embodiments, at least one of the processes and/or methods is implemented as a software application that is a portion of an EDA tool. In some embodiments, a portion or all of the processes and/or methods is implemented as a software application that is used by the system 1800. In some embodiments, a layout diagram which includes standard and/or previously designed cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium (e.g., the storage device 1804). Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the system 1800 may include the fabrication tools 1808 for implementing the processes and/or methods stored in the storage device 1804. For instance, a synthesis may be performed on a design in which the behavior and/or functions desired from the design are transformed to a functionally equivalent logic gate-level circuit description by matching the design to cells selected from the cell library 1818. The synthesis results in a functionally equivalent logic gate-level circuit description, such as a gate-level netlist. Based on the gate-level netlist, a photolithographic mask may be generated that is used to fabricate the IC by the fabrication tools 1808. Further aspects of device fabrication are disclosed in conjunction with FIG. 19, which is a block diagram of an integrated circuit manufacturing system, and a manufacturing flow associated therewith, in accordance with some embodiments. In some embodiments, based on a layout diagram, at least one of: (a) one or more semiconductor masks; or (b) at least one component in a layer of a semiconductor IC is fabricated using the IC manufacturing system 1900.

Figure 19:
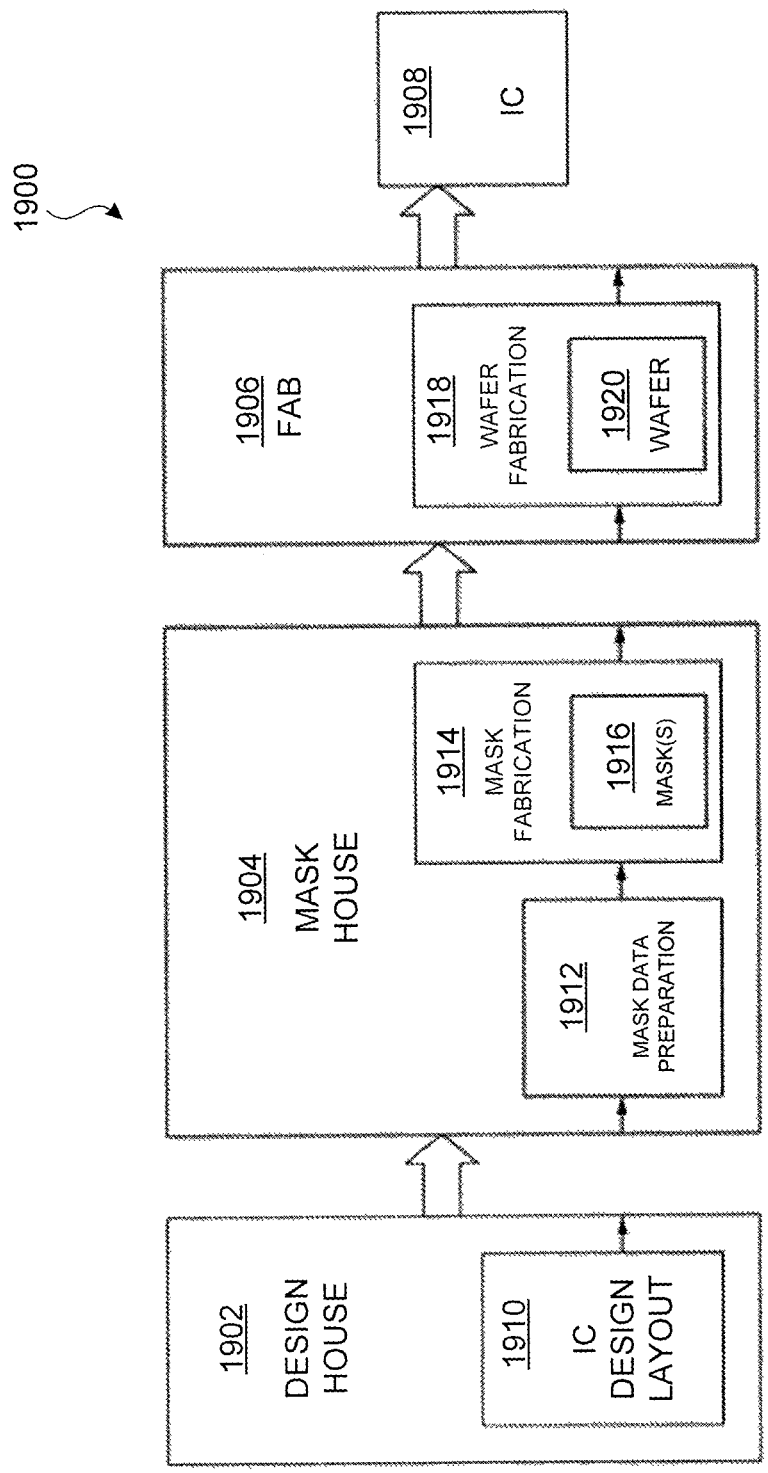
FIG. 19 depicts a block diagram of an example integrated circuit manufacturing system and manufacturing flow in accordance with some embodiments.

FIG. 19 depicts a block diagram of an example integrated circuit manufacturing system and manufacturing flow in accordance with some embodiments. In the illustrated embodiment, the IC manufacturing system 1900 includes entities, such as a design house 1902, a mask house 1904, and an IC manufacturer/fabricator ("fab") 1906, that interact with one another in the design, development, and manufacturing cycles and/or services related to manufacturing an IC 1908, such as the ICs disclosed herein. The entities in the IC manufacturing system 1900 are operably connected by a communication network (not shown). In some embodiments, the communication network is a single network. In some embodiments, the communication network is a variety of different networks, such as an intranet and the Internet. The communication network includes wired and/or wireless communication channels.

Each entity interacts with one or more of the other entities and provides services to and/or receives services from one or more of the other entities. In some embodiments, two or more of the design house 1902, the mask house 1904, and the IC fab 1906 is owned by a single company. In some embodiments, two or more of the design house 1902, the mask house 1904, and the IC fab 1906 coexist in a common facility and use common resources.

The design house (or design team) 1902 generates an IC design layout diagram 1910. The IC design layout diagram 1910 includes various geometrical patterns, or IC layout diagrams designed for the IC 1908 to be fabricated. The geometrical patterns correspond to patterns of metal, oxide, or semiconductor layers that make up the various components of the IC 1908 to be fabricated. The various layers combine to form various IC features. For example, a portion of the IC design layout diagram 1910 includes various IC features, such as active diffusion regions, gate electrodes, source and drain, metal lines or local vias, and openings for bonding pads, to be formed in a semiconductor substrate (such as a silicon wafer) and various material layers disposed on the semiconductor substrate.

The design house 1902 implements a design procedure to form the IC design layout diagram 1910. The design procedure includes one or more of logic design, physical design or place and route. The IC design layout diagram 1910 is presented in one or more data files having information of the geometrical patterns. For example, the IC design layout diagram 1910 can be expressed in a GDS file format, a GDSII file format, or a DFII file format.

The mask house 1904 includes mask data preparation 1912 and mask fabrication 1914. The mask house 1904 uses the IC design layout diagram 1910 to manufacture one or more masks 1916 to be used for fabricating the various layers of the IC 1908 according to the IC design layout diagram 1910. The mask house 1904 performs mask data preparation 1912, where the IC design layout diagram 1910 is translated into a representative data file ("RDF"). The mask data preparation 1912 provides the RDF to the mask fabrication 1914. The mask fabrication 1914 includes a mask writer (not shown) that converts the RDF to an image on a substrate, such as a mask (reticle) 1916 on a semiconductor wafer. The IC design layout diagram 1910 is manipulated by the mask data preparation 1912 to comply with particular characteristics of the mask writer and/or requirements of the IC fab 1906. In FIG. 19, the mask data preparation 1912 and the mask fabrication 1914 are illustrated as separate elements. In some embodiments, the mask data preparation 1912 and the mask fabrication 1914 can be collectively referred to as a mask data preparation.

In some embodiments, the mask data preparation 1912 includes an optical proximity correction (OPC) that uses lithography enhancement techniques to compensate for image errors, such as those that can arise from diffraction, interference, other process effects and the like. The OPC adjusts the IC design layout diagram 1910. In some embodiments, the mask data preparation 1912 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1912 includes a mask rule checker (MRC) (not shown) that checks the IC design layout diagram 1910 that has undergone processes in OPC with a set of mask creation rules that contain certain geometric and/or connectivity restrictions to ensure sufficient margins, to account for variability in semiconductor manufacturing processes, and the like. In some embodiments, the MRC modifies the IC design layout diagram 1910 to compensate for limitations during the mask fabrication, which may undo part of the modifications performed by OPC in order to meet mask creation rules.

In some embodiments, the mask data preparation 1912 includes lithography process checking (LPC) (not shown) that simulates processing that will be implemented by the IC fab 1906 to fabricate the IC 1908. LPC simulates this processing based on the IC design layout diagram 1910 to create a simulated manufactured device, such as the IC 1908. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, and if the simulated device is not sufficiently close in shape to satisfy design rules, OPC and/or MRC are be repeated to further refine the IC design layout diagram 1910.

It should be understood that the above description of the mask data preparation 1912 has been simplified for the purposes of clarity. In some embodiments, the mask data preparation 1912 includes additional features such as a logic operation (LOP) to modify the IC design layout diagram 1910 according to manufacturing rules. Additionally, the processes applied to the IC design layout diagram 1910 during the mask data preparation 1912 may be executed in a variety of different orders.

After the mask data preparation 1912 and during the mask fabrication 1914, a mask 1916 or a group of masks 1916 are fabricated based on the IC design layout diagram 1910. In some embodiments, the mask fabrication 1914 includes performing one or more lithographic exposures based on the IC design layout diagram 1910. In some embodiments, an electron-beam (e-beam) or a mechanism of multiple e-beams is used to form a pattern on a mask(s) 1916 (photomask or reticle) based on the IC design layout diagram 1910. The mask(s) 1916 can be formed in various technologies. For example, in some embodiments, the mask(s) 1916 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask(s) 1916 includes a transparent substrate (e.g., fused quartz) and an opaque material (e.g., chromium) coated in the opaque regions of the binary mask.

In another example, the mask(s) 1916 is formed using a phase shift technology. In a phase shift mask (PSM) version of the mask(s) 1916, various features in the pattern formed on the phase shift mask are configured to have a proper phase difference to enhance the resolution and imaging quality. In various examples, the phase shift mask can be attenuated PSM or alternating PSM. The mask(s) 1916 generated by the mask fabrication 1914 is used in a variety of processes. For example, a mask(s) 1916 is used in an ion implantation process to form various doped regions in the semiconductor wafer, in an etching process to form various etching regions in the semiconductor wafer, and/or in other suitable processes.

The IC fab 1906 includes wafer fabrication 1918. The IC fab 1906 is an IC fabrication business that includes one or more manufacturing facilities for the fabrication of a variety of different IC products. In some embodiments, the IC fab 1906 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 1906 uses the mask(s) 1916 fabricated by the mask house 1904 to fabricate the IC 1908. Thus, the IC fab 1906 at least indirectly uses the IC design layout diagram 1910 to fabricate the IC 1908. In some embodiments, a semiconductor wafer 1920 is fabricated by the IC fab 1906 using the mask(s) 1916 to form the IC 1908. In some embodiments, the IC fab 1906 includes performing one or more lithographic exposures based at least indirectly on the IC design layout diagram 1910. The semiconductor wafer 1920 includes a silicon substrate or other proper substrate having material layers formed thereon. The semiconductor wafer 1920 further includes one or more of various doped regions, dielectric features, multilevel interconnects, and the like (formed at subsequent manufacturing steps).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, an integrated circuit includes one or more cells (e.g., devices). The integrated circuit includes a substrate and a first backside conductive layer formed over a backside of the substrate. A second backside conductive layer is formed over the first backside conductive layer. The first and the second backside conductive layers each includes conductive segments. The conductive segments in the second backside conductive layer are configured to transmit power signals. The conductive segments of the first and the second backside conductive layers cover select areas of the backside of the substrate to leave other areas of the backside of the substrate exposed. One area of the backside of the substrate that is exposed comprises an output region of the cell.

In another aspect, an integrated circuit includes one or more cells. The integrated circuit includes a substrate and a first backside conductive layer formed over a backside of the substrate. A second backside conductive layer is formed over the first backside conductive layer. The first and the second backside conductive layers each includes conductive segments. The conductive segments in the second backside conductive layer are configured to transmit power signals. The conductive segments of the first and the second backside conductive layers cover select areas of the backside of the substrate to leave other areas of the backside of the substrate exposed. One area of the backside of the substrate that is covered by the conductive segments comprises a power region of the cell.

In yet another aspect, a method includes forming a first active diffusion (AD) region and a second AD region in a backside of a substrate. A first backside conductive layer is formed over the backside of the substrate. A second backside conductive layer is formed over the first backside conductive layer. The first and the second backside conductive layers each includes conductive segments. The conductive segments in the second backside conductive layer are configured to transmit power signals. The conductive segments of the first and the second backside conductive layers cover select areas of the backside of the substrate to leave other areas of the backside of the substrate exposed.

What is claimed is:

1. An integrated circuit comprising a cell, comprising:
   a substrate having a frontside of the substrate and a backside of the substrate;
   a device formed in the substrate;
   a first active diffusion (AD) region formed in the backside of the substrate;
   a second AD region formed in the backside of the substrate and adjacent the first AD region;
   a frontside conductive layer formed over the frontside of the substrate and electrically connected to the device;
   a first backside conductive layer formed over the backside of the substrate and comprising a first plurality of conductive segments; and
   a second backside conductive layer formed over the first backside conductive layer, the second backside conductive layer comprising a second plurality of conductive segments wherein:
   the first plurality of conductive segments and the second plurality of conductive segments cover the first AD region from directly above the second backside conductive layer and define an opening directly above the second AD region such that the second AD region is exposed from above the second backside conductive layer; and
   the second AD region that is exposed comprises an output region of the cell that is detectable with at least one of a laser, an emission microscopy, or an electron beam from above the second backside conductive layer.

2. The integrated circuit of claim 1, further comprising a third backside conductive layer formed over the second backside conductive layer, the third backside conductive layer comprising a third plurality of conductive segments that cover only select areas of the backside of the substrate to leave other areas of the backside of the substrate exposed.

3. The integrated circuit of claim 2, wherein an area of at least a top section or a bottom section of a respective conductive segment in the third plurality of conductive segments has a larger area compared to a middle section of the respective conductive segment.

4. The integrated circuit of claim 2, wherein the other areas of the backside of the substrate that are exposed are detectable with at least one of the laser, the emission microscopy, or the electron beam from above the third backside conductive layer.

5. The integrated circuit of claim 1, wherein the integrated circuit further comprises:
a conductive via electrically connecting a respective conductive segment in the first plurality of conductive segments to the first AD region.

6. The integrated circuit of claim 5, further comprising gate lines formed below the first backside conductive layer and over the first and the second AD regions.

7. The integrated circuit of claim 1, wherein a respective conductive segment in the second plurality of conductive segments contacts directly a respective conductive segment in the first plurality of conductive segments.

8. The integrated circuit of claim 1, wherein the integrated circuit further comprises a conductive contact formed between a respective conductive segment in the first plurality of conductive segments and a respective conductive segment in the second plurality of conductive segments.

9. An integrated circuit comprising a cell, comprising:
a substrate;
a device formed in the substrate;
a frontside conductive layer formed over a frontside of the substrate and electrically connected to the device;
a first backside conductive layer formed over a backside of the substrate, the first backside conductive layer comprising a first plurality of conductive segments;
a second backside conductive layer formed over the first backside conductive layer and comprising a second plurality of conductive segments that are configured to transmit power signals;
a first active diffusion (AD) region formed in the backside of the substrate; and
a second AD region formed in the backside of the substrate and adjacent the first AD region, wherein:
the first plurality and the second plurality of conductive segments cover the first AD region from directly above second backside conductive layer and define an opening directly above the second AD region such that the second AD region is exposed from above the second backside conductive layer and detectable with at least one of a laser, an emission microscopy, or an electron beam from above the second backside conductive layer; and
one area of the backside of the substrate that is covered by the conductive segments comprises a power region of the cell that is detectable with at least one of the laser, the emission microscopy, or the electron beam from above the second backside conductive layer.

10. The integrated circuit of claim 9, further comprising a third backside conductive layer formed over the second backside conductive layer and comprising a third plurality of conductive segments.

11. The integrated circuit of claim 10, wherein an area of at least a top section or a bottom section of a respective conductive segment in the third plurality of conductive segments has a larger area compared to an area of a middle section of the respective conductive segment.

12. The integrated circuit of claim 10, wherein other areas of the backside of the substrate that are exposed are detectable with at least one of the laser, the emission microscopy, or the electron beam from above the third backside conductive layer.

13. The integrated circuit of claim 9, wherein the integrated circuit further comprises:
a conductive via electrically connecting a respective conductive segment in the first plurality of conductive segments to the first AD region.

14. The integrated circuit of claim 13, further comprising gate lines formed below the first backside conductive layer and over the first and the second AD regions.

15. The integrated circuit of claim 9, wherein a respective conductive segment in the second plurality of conductive segments contacts directly a respective conductive segment in the first plurality of conductive segments.

16. The integrated circuit of claim 9, wherein the integrated circuit further comprises a conductive contact formed between a respective conductive segment in the first plurality of conductive segments and a respective conductive segment in the second plurality of conductive segments.

17. A method, comprising:
forming a first active diffusion (AD) region in a backside of a substrate;
forming a second AD region in the backside of the substrate and adjacent the first AD region;
forming a device in the substrate;
forming a frontside conductive layer over a frontside of the substrate and electrically connecting the frontside conductive layer to the device;
forming a first backside conductive layer over the backside of the substrate that includes a first plurality of conductive segments; and
forming a second backside conductive layer over the first backside conductive layer that includes a second plurality of conductive segments, wherein:
the second plurality of conductive segments are configured to transmit power signals; and
the first and the second conductive segments cover the first AD region from directly above the second backside conductive layer and define an opening directly above the second AD region such that the second AD region is exposed and detectable with at least one of a laser, an emission microscopy, or an electron beam from above the second backside conductive layer.

18. The method of claim 17, wherein the forming of the first backside conductive layer comprises forming a respective conductive segment in the first plurality of conductive segments to contact directly a respective conductive segment in the second plurality of conductive segments.

19. The method of claim 17, further comprising forming a conductive contact between a respective conductive segment in the first plurality of conductive segments and a respective conductive segment in the second plurality of conductive segments.

20. The method of claim 17, further comprising:
forming a third backside conductive layer over the second backside conductive layer, the third backside conductive layer comprising a third plurality of conductive segments,
wherein the forming of the third backside conductive layer comprises forming a respective conductive segment in the third plurality of conductive segments to have an area at least a top section or a bottom section of the respective conductive segment that is larger than an area of a middle section of the respective conductive segment.

* * * * *